US008014891B2

(12) United States Patent
Saito

(10) Patent No.: US 8,014,891 B2
(45) Date of Patent: Sep. 6, 2011

(54) ETCHING AMOUNT CALCULATING METHOD, STORAGE MEDIUM, AND ETCHING AMOUNT CALCULATING APPARATUS

(75) Inventor: Susumu Saito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 436 days.

(21) Appl. No.: 12/353,457

(22) Filed: Jan. 14, 2009

(65) Prior Publication Data

US 2009/0186483 A1 Jul. 23, 2009

Related U.S. Application Data

(60) Provisional application No. 61/095,645, filed on Sep. 10, 2008, provisional application No. 61/033,277, filed on Mar. 3, 2008.

(30) Foreign Application Priority Data

Jan. 17, 2008 (JP) .................................. 2008-008312
Jul. 25, 2008 (JP) .................................. 2008-192311

(51) Int. Cl.
*G06F 19/00* (2011.01)
*G01L 21/30* (2006.01)
*C23F 1/00* (2006.01)
*G01B 9/02* (2006.01)

(52) U.S. Cl. ............ 700/121; 700/108; 216/60; 216/85; 356/450; 356/505; 356/509

(58) Field of Classification Search .................. 700/108, 700/121; 216/60, 85; 438/8, 9, 689; 156/345.24, 156/345.25; 356/450, 451, 496, 504–506, 356/509, 512
See application file for complete search history.

(56) References Cited

U.S. PATENT DOCUMENTS 5,110,211 A * 5/1992 Niki et al. ...................... 356/451
6,826,511 B2 * 11/2004 Mikkelsen et al. ........... 702/172

FOREIGN PATENT DOCUMENTS
JP  2-71517  3/1990
* cited by examiner

*Primary Examiner* — Sean Shechtman
(74) *Attorney, Agent, or Firm* — Oblon, Spivak, McClelland, Maier & Neustadt, L.L.P.

(57) ABSTRACT

An etching amount calculating method that can stably and accurately calculate the amount of etching even if a disturbance is added. Superposed interference light resulting from superposition of interference light of reflected light from a mask film and reflected light from the bottom of a concave portion on other interference light is received. A waveform in a predetermined time period is extracted from a superposed interference wave calculated from the superposed interference light. The period of an interference wave of the reflected light from the mask film and the reflected light from the bottom is detected from the distribution of frequencies of the extracted waveform. The steps described above are repeated while shifting the predetermined time period by a predetermined time, and the detected periods are integrated and averaged at each repetition. The etching amount of the concave portion is calculated based on the integrated and averaged periods.

13 Claims, 26 Drawing Sheets

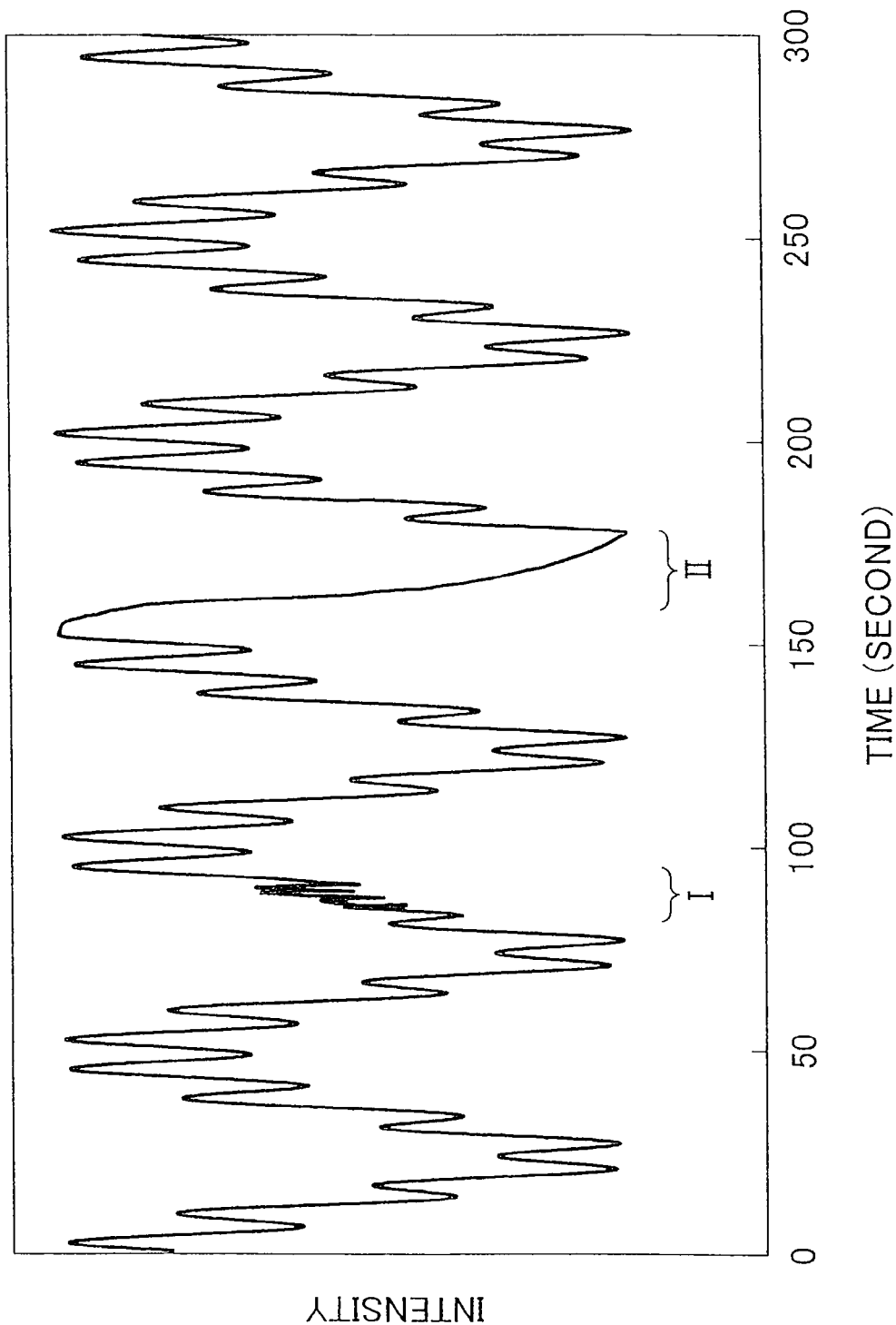

INTERFERENCE PERIOD THAT DOES NOT EXIST UNDER NORMAL CONDITIONS

ETCHING AMOUNT CALCULATING METHOD, STORAGE MEDIUM, AND ETCHING AMOUNT CALCULATING APPARATUS

BACKGROUND OF THE INVENTION

1. Field of the Invention

The present invention relates to an etching amount calculating method, a storage medium, and an etching amount calculating apparatus, and in particular to an etching amount calculating method for use in forming concave portions such as trenches and holes on a wafer using a mask film.

2. Description of the Related Art

In a process of manufacturing a semiconductor device, etching in which trenches and holes are formed in a to-be-etched layer of a wafer is carried out using a mask film. In the etching, a to-be-etched layer in a part that is not covered with the mask film is physically/chemically etched by plasma, and in forming a trench, the depth of the trench has to be controlled. Thus, the depth of the trench, i.e. the etching amount has to be calculated during etching, and conventionally, a method using light interference has been widely used as a method of calculating the etching amount.

FIG. 22 is a view useful in explaining light interference during etching.

Referring to FIG. 22, a trench 132 is formed through etching on a wafer W that has a mask film 131 formed on a to-be-etched layer 130. When the laser light L1 is irradiated on the wafer W, reflected light $L_2$ from a surface of the mask film 131, reflected light $L_3$ from a boundary surface between the mask film 131 and the to-be-etched layer 130, and reflected light $L_4$ from a bottom of the trench 132 are produced.

When the reflected lights $L_2$ to $L_4$ are received by a detector, optical path lengths of the reflected lights $L_2$ to $L_4$ differ according to the thickness of the mask film 131 and the depth of the trench 132 as shown in FIG. 22, and hence the phases of the reflected lights $L_2$ to $L_4$ differ on the light-receiving surface of the detector. Therefore, interference light (for example, interference light of the reflected light $L_2$ and the reflected light $L_4$ (hereinafter referred to as "trench interference light") and interference light of the reflected light $L_2$ and the reflected light $L_3$ (hereinafter referred to as "mask film interference light")) are produced.

The depth of the trench 132 momentarily changes during etching, and thus the difference in the optical path length of the reflected light $L_2$ and the reflected light $L_4$ also momentarily changes, causing a change in the intensity of the interference light. That is, an interference wave (hereinafter referred to as "trench interference wave") is produced from the reflected light $L_2$ and the reflected light $L_4$. The period of the interference wave is determined by the rate of change in the depth of the trench 132 (etching rate), and hence the etching rate can be calculated from the period of the interference wave. Further, the etching amount (the depth of the trench 132) can be calculated from the calculated etching rate and an etching time period.

During etching, the mask film 131 is also minutely etched step by step to change its thickness, and hence an interference wave (hereinafter referred to as "mask film interference wave") is produced from the reflected light $L_2$ and the reflected light $L_3$ as well. Because these interference waves are detected by the same detector, the interference wave detected by the detector consist of a plurality of superposed interference waves having different periods (hereinafter referred to as "superposed interference wave") (see FIG. 23).

To calculate the depth of the trench 132 (the etching amount of the to-be-etched layer 130) from the superposed interference wave as shown in FIG. 23, the trench interference wave has to be separated from the superposed interference wave.

In the superposed interference wave in FIG. 23, an interference wave with a short period and an interference wave with a long period can be relatively clearly separated. Here, because the rate of change in the depth of the trench 132 is higher than the rate of change in the thickness of the mask film 131 during etching, the period of the trench interference wave is shorter than that of the mask film interference wave. Thus, the interference wave with a short period in the superposed interference wave in FIG. 23 is the trench interference wave, and the period of the trench interference wave can be easily calculated from a time period ("$\Delta t$" in the figure) between extreme values of the interference wave with a short period.

In the method in which the time period between extreme values is read from a superposed interference wave, an interference wave with a short period and an interference wave with a long period have to be relatively clearly separated in the superposed interference wave, and the period of the trench interference wave cannot be calculated if it is difficult to separate the interference wave with a short period and the interference wave with a long period in a superposed interference wave. Moreover, between extreme values of an interference wave with a short period, the period of the trench interference wave is regarded as being fixed, and hence the calculated periods of the trench interference wave (the etching rates of the to-be-etched layer 130) are in tiers as shown in FIG. 24. That is, the resolution is low in the method in which a time period between extreme values is read from a superposed interference wave.

Accordingly, in recent years, a method in which the period of a trench interference wave is calculated by carrying out a frequency analysis without reading a time period between extreme values from a superposed interference wave. In this method, the distribution of frequencies (see FIG. 26A) is obtained from a superposed interference wave by a frequency analysis (for example, a fast Fourier transformation method) to detect the period of a trench interference wave from the distribution of frequencies (see, for example, Japanese Laid-open Patent Publication (Kokai) No. H02-71517).

However, as shown in FIG. 25, there may be the case where a disturbance such as an abnormality in a laser light source or a detector ("I" in the figure) or a disturbance such as an apparent change in period ("II" in the figure) caused by interference of a mask film interference wave and a trench interference wave is added to a superposed interference wave. In the above described method using a frequency analysis, the period of a trench interference wave is only detected from the distribution of frequencies obtained by analyzing a superposed interference wave over the whole time period of etching, and hence if a disturbance is added to the superposed interference wave, the distribution of frequencies is not accurate due to, for example, the occurrence of a peak in an interference period that does not exist under normal conditions (see FIG. 26B), and as a result, the etching amount cannot be stably and accurately calculated.

SUMMARY OF THE INVENTION

The present invention provides an etching amount calculating method, a storage medium, and an etching amount calculating apparatus that can stably and accurately calculate the amount of etching even if a disturbance is added.

Accordingly, in a first aspect of the present invention, there is provided an etching amount calculating method for calculating an etching amount of a concave portion that is formed in a substrate using a mask film by etching the substrate comprising an irradiating step of irradiating light on the substrate, a light receiving step of receiving superposed interference light resulting from superposition of at least interference light of reflected light from the mask film and reflected light from a bottom of the concave portion on other interference light, an interference wave calculating step of calculating a superposed interference wave from the received superposed interference light, a waveform extracting step of extracting a waveform in a predetermined time period from the superposed interference wave, a frequency analyzing step of carrying out a frequency analysis of the extracted waveform, an interference period detecting step of detecting a period of an interference wave of the reflected light from the mask film and the reflected light from the bottom of the concave portion from a frequency distribution obtained by the frequency analysis, an integrating and averaging step of repeating the interference wave calculating step, the waveform extracting step, the frequency analyzing step, and the interference period detecting step while shifting the predetermined time period by a predetermined time, and integrating and averaging the detected periods of the interference wave at each repetition, and an etching amount calculating step of calculating the etching amount of the concave portion based on the integrated and averaged periods of the interference wave.

According to the first aspect of the present invention, the calculation of the superposed interference wave, the extraction of a waveform in the predetermined time period, the frequency analysis, and the detection of the period of the interference wave produced from the reflected light from the mask film and the reflected light from the bottom of the concave portion are repeated while shifting the predetermined time period by a predetermined time, and the periods of the interference waves detected are integrated and averaged at the respective repetitions to calculate the etching amount of the concave portion based on the integrated and averaged periods. Therefore, even if a disturbance is added to an extracted waveform in a certain predetermined time period, the period of an interference wave detected based on the waveform in the certain predetermined time period and periods of the interference waves detected based on waveforms in other predetermined time periods are integrated and averaged, and hence the effect of the period of the interference wave detected based on the waveform in the predetermined time period in which the disturbance is added on the integrated and averaged period of the interference wave can be made small, and thus, even if a disturbance is added, the etching amount can be stably and accurately calculated.

The first aspect of the present invention can provide an etching amount calculating method, wherein the predetermined time period is longer than one period of a waveform of the other interference light whose period is longer than the period of the interference wave of the reflected light from the mask film and the reflected light from the bottom of the concave portion.

According to the first aspect of the present invention, because the predetermined time period is longer than one period of a waveform of other interference light whose period is longer than the period of the interference wave produced from the reflected light from the mask film and the reflected light from the bottom of the concave portion, the reliability of the frequency analysis of a waveform in the predetermined time period can be improved, and as a result, the etching amount can be accurately calculated.

The first aspect of the present invention can provide an etching amount calculating method further comprising a pre-analysis processing step of removing almost all of a part occupied by the waveform of the other interference light from the waveform in the predetermined time period extracted from the superposed interference wave, wherein in the frequency analyzing processing step, a frequency analysis of the waveform from which almost all of the part occupied by the waveform of the other interference light has been removed is carried out.

According to the first aspect of the present invention, if the period of a waveform of other interference light is longer than the period of the interference wave produced from the reflected light from the mask film and the reflected light from the bottom of the concave portion, almost all of a part occupied by the waveform of the other interference light is removed from the waveform in the predetermined time period extracted from the superposed interference wave, and therefore, even if the light quantity of the reflected light from the bottom of the concave portion is small and the waveform of the other interference light occupies almost all of the superposed interference wave, the percentage of the part occupied by the interference wave produced from the reflected light from the mask film and the reflected light from the bottom of the concave portion in the waveform after the removal can be increased, and as a result, the period of the interference wave produced from the reflected light from the mask film and the reflected light from the bottom of the concave portion can be accurately calculated by a frequency analysis.

The first aspect of the present invention can provide an etching amount calculating method, wherein in the pre-analysis processing step, a waveform obtained by approximating the extracted waveform by a quadratic polynomial is removed from the extracted waveform.

According to the first aspect of the present invention, a waveform is extracted prior to the frequency analysis, and a waveform obtained by approximating the extracted waveform by a quadratic polynomial is removed from the extracted waveform. If the light quantity of the reflected light from the bottom of the concave portion is small and the waveform of the other interference light occupies almost all of the superposed interference wave, the waveform of the superposed interference wave is substantially the same as the waveform of the other interference light, and hence the waveform approximating the extracted superposed interference wave by a quadratic polynomial is also substantially the same as the waveform of the other interference light. Therefore, almost all of the part occupied by the waveform of the other interference light can be reliably removed from the extracted waveform.

The first aspect of the present invention can provide an etching amount calculating method, wherein the predetermined time period is not more than a ¼ period of the waveform of the other interference light.

According to the first aspect of the present invention, the predetermined time period is not more than a ¼ period of the waveform of the other interference light. The waveform of the other interference light which occupies almost all of the superposed interference wave is close to a sine wave, and hence if the part of the waveform of the other interference light with a ¼ period or less is extracted, the extracted waveform can be accurately approximated by a quadratic polynomial. As a result, almost all of the part occupied by the waveform of the other interference light can be removed accurately from the extracted waveform.

The first aspect of the present invention can provide an etching amount calculating method, wherein an opening rate of the concave portion on the surface of the substrate is not more than 0.5%, or the concave portion is a deep trench.

The first aspect of the present invention can provide an etching amount calculating method, wherein in the frequency analysis, a maximum entropy method is used.

According to the first aspect of the present invention, because the maximum entropy method is used for the frequency analysis, the reliability of the frequency analysis can be improved even if the number of waveforms in predetermined time periods is small, and as a result, the etching amount can be more accurately calculated.

The first aspect of the present invention can provide an etching amount calculating method, further comprising an interference period correcting step of removing the period of the interference wave in the case where the period of the interference wave detected from the frequency distribution corresponds to an abnormal value.

According to the first aspect of the present invention, if the period of the interference wave detected from the distribution of frequencies is an abnormal value, the period of the interference wave is removed, and hence the effect of the interference wave detected based on the waveform in the predetermined time period in which a disturbance is added on the integrated and averaged periods of the interference wave can be eliminated. As a result, even if a disturbance is added, the etching amount can be more stably and accurately calculated.

The first aspect of the present invention can provide an etching amount calculating method, wherein in the interference period correcting step, the period of the interference wave obtained from the predetermined time period before or the predetermined time period after the predetermined time period in which the period of the interference wave corresponding to the abnormal value is obtained is regarded as the period of the interference wave of the predetermined time period in which the period of the interference wave corresponding to the abnormal value is obtained.

According to the first aspect of the present invention, because the period of the interference wave obtained from the predetermined time period before or the predetermined time period after the predetermined time period in which the period of the interference wave corresponding to an abnormal value is obtained is regarded as the period of the interference wave in the predetermined time period in which the period of the interference wave corresponding to the abnormal value is obtained. Therefore, the effect of interference light detected based on a waveform in the predetermined time period in which a disturbance is added can be reliably eliminated.

The first aspect of the present invention can provide an etching amount calculating method, wherein the period of the interference wave of the reflected light from the mask film and the reflected light from the bottom of the concave portion is estimated in advance, and in the interference period detecting step, in the frequency distribution obtained by the frequency analysis, the period of the interference wave of the reflected light from the mask film and the reflected light from the bottom of the concave portion is detected from a vicinity of the estimated period.

According to the first aspect of the present invention, because the period of the interference wave produced from the reflected light from the mask film and the reflected light from the bottom of the concave portion is estimated in advance, and in the distribution of frequencies obtained by the frequency analysis of the waveform in the predetermined time period, the period of the interference wave is detected from the vicinity of the estimated period. Thus, the period of the interference wave can be quickly detected, and an abnormal value can be prevented from being detected.

The first aspect of the present invention can provide an etching amount calculating method, wherein the other interference light is interference light of reflected light from a surface of the mask film and reflected light from a boundary surface between the mask film and a surface of the substrate.

Accordingly, in a second aspect of the present invention, there is provided a computer-readable storage medium storing a program for causing a computer to execute an etching amount calculating method for calculating an etching amount of a concave portion that is formed in a substrate using a mask film by etching the substrate, the etching amount calculating method comprising an irradiating step of irradiating light on the substrate, a light receiving step of receiving superposed interference light resulting from superposition of at least interference light of reflected light from the mask film and reflected light from a bottom of the concave portion on other interference light, an interference wave calculating step of calculating a superposed interference wave from the received superposed interference light, a waveform extracting step of extracting a waveform in a predetermined time period from the superposed interference wave, a frequency analyzing step of carrying out a frequency analysis of the extracted waveform, an interference period detecting step of detecting a period of an interference wave of the reflected light from the mask film and the reflected light from the bottom of the concave portion from a frequency distribution obtained by the frequency analysis, an integrating and averaging step of repeating the interference wave calculating step, the waveform extracting step, the frequency analyzing step, and the interference period detecting step while shifting the predetermined time period by a predetermined time, and integrating and averaging the detected periods of the interference wave at each repetition, and an etching amount calculating step of calculating the etching amount of the concave portion based on the integrated and averaged periods of the interference wave.

Accordingly, in a third aspect of the present invention, there is provided an etching amount calculating apparatus that calculates an etching amount of a concave portion that is formed in a substrate using a mask film by etching the substrate comprising an irradiating unit that irradiates light on the substrate, a light receiving unit that receives superposed interference light resulting from superposition of at least interference light of reflected light from the mask film and reflected light from a bottom of the concave portion on other interference light, an interference wave calculating unit that calculates a superposed interference wave from the received superposed interference light, a waveform extracting unit that extracts a waveform of a predetermined time period from the superposed interference wave, a frequency analyzing unit that carries out a frequency analysis of the extracted waveform, an interference period detecting unit that detects a period of an interference wave of the reflected light from the mask film and the reflected light from the bottom of the concave portion from a frequency distribution obtained by the frequency analysis, an integrating and averaging unit that repeats the interference wave calculation, the waveform extraction, the frequency analysis, and the interference period detection while shifting the predetermined time period by a predetermined time, and integrates and averages the detected periods of the interference wave at each repetition, and an etching amount calculating unit that calculates the etching amount of the concave portion based on the integrated and averaged period of the interference wave.

The features and advantages of the invention will become more apparent from the following detailed description taken in conjunction with the accompanying drawings.

BRIEF DESCRIPTION OF THE DRAWINGS

FIG. 25 is a diagram showing a superposed interference wave to which a disturbance has been added; and FIGS. 26A and 26B are diagrams showing the distribution of frequencies obtained by a frequency analysis of a superposed interference wave, in which FIG. 26A shows the case where no disturbance has been added to the superposed interference wave, and FIG. 26B shows the case where a disturbance has been added to the superposed interference wave.

DETAILED DESCRIPTION OF PREFERRED EMBODIMENTS

The present invention will now be described in detail with reference to the drawings showing preferred embodiments thereof.

First, a description will be given of an etching amount calculating method according to a first embodiment of the present invention and a substrate processing apparatus to which the etching amount calculating method is applied. This substrate processing apparatus is constructed such as to carry out etching using plasma on a semiconductor wafer (hereinafter simply referred to as "wafer") W as a substrate. It should be noted that the wafer W has a to-be-etched layer 130 and a mask film 131 formed in a predetermined pattern on the to-be-etched layer 130.

Figure 1:
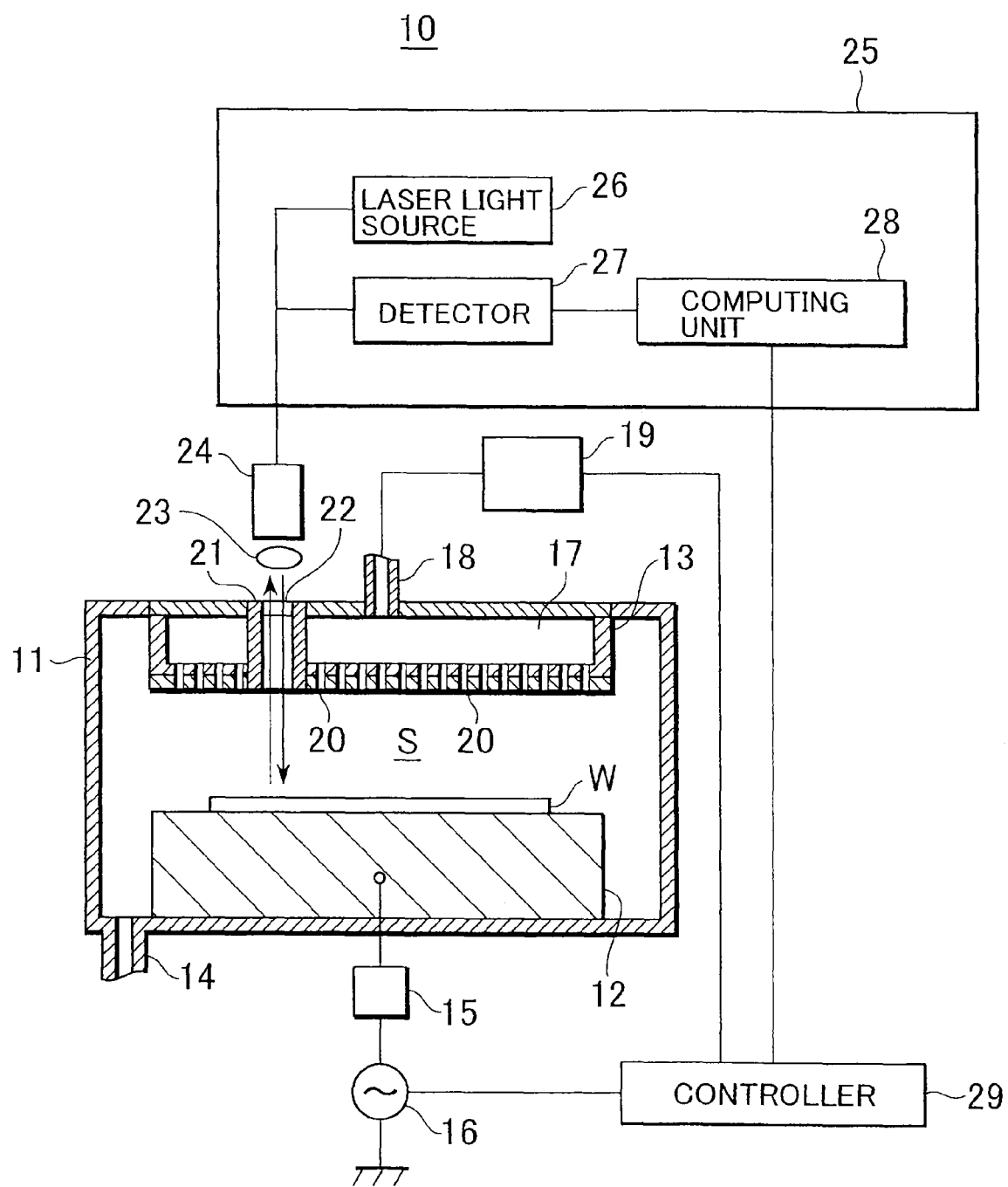
FIG. 1 is a cross-sectional view schematically showing the construction of a substrate processing apparatus to which an etching amount calculating method according to a first embodiment of the present invention is applied.

FIG. 1 is a cross-sectional view schematically showing the construction of the substrate processing apparatus to which the etching amount calculating method according to the present invention is applied.

Referring to FIG. 1, the substrate processing apparatus 10 has a processing chamber 11 made of a conductive material such as aluminum, a lower electrode 12 on a bottom surface of the processing chamber 11 as a mounting stage on which the wafer W is mounted, and a showerhead 13 disposed above and at a predetermined distance away from the lower electrode 12.

An evacuating portion 14 to which an evacuating apparatus, not shown, is connected is connected to a lower portion of the processing chamber 11, and a high-frequency power supply 16 is connected to the lower electrode 12 via a matcher 15. A processing gas introducing pipe 18 is connected to a buffer chamber 17 inside the showerhead 13, and a processing gas supply unit 19 is connected to the processing gas introducing pipe 18. The showerhead 13 has in a lower portion thereof a plurality of gas holes 20 that communicate together the buffer chamber 17 and a processing space S, which is a space between the showerhead 13 and the lower electrode 12. The showerhead 13 supplies a process gas introduced from the processing gas introducing pipe 18 into the buffer chamber 17 to the processing space S via the plurality of gas holes 20.

In the substrate processing apparatus 10, after the evacuating portion 14 decompresses the interior of the processing chamber 11 to a predetermined vacuum state, a process gas is supplied from the showerhead 13 into the processing space S under conditions in which a high-frequency voltage has been applied to the processing space S from the lower electrode 12 to produce plasma from the process gas in the processing space S. The produced plasma collides with and contacts the to-be-etched layer 130 of the wafer W, which is not covered with the mask film 131, to etch the to-be-etched layer 130, whereby a trench 132 (concave portion) is formed in the to-be-etched layer 130.

A monitor unit 21 for observing the wafer mounted on the lower electrode 12 from above is disposed in the showerhead 13 in the processing chamber 11. The monitor unit 21 is formed of a cylindrical member and penetrates the shower head 13. A window member 22 formed of a transparent body such as quarts glass is provided at an upper end of the monitor unit 21. An optical fiber 24 is disposed above the processing chamber 11 in a manner opposed to the upper end of the monitor unit 21 via a collecting lens 23.

The optical fiber 24 is connected to an etching amount calculating apparatus 25 that calculates the etching amount of the to-be-etched layer 130. The etching amount calculating apparatus 25 has a laser light source 26 (irradiating unit) and a detector 27 (light-receiving unit), which are connected to the optical fiber 24, and a computing unit 28 (interference wave calculating unit, waveform extracting unit, frequency analyzing unit, interference period detecting unit, integrating and averaging unit, and etching amount calculating unit) connected to the detector 27, and operates under control of a controller 29 of the substrate processing apparatus 10. A semiconductor laser, for example, is used as the laser light source 26. A photomultiplier or a photodiode, for example, is used as the detector 27. It should be noted that the controller 29 is connected to not only the computing unit 28 but also the component elements of the substrate processing apparatus 10 such as the high-frequency power supply 16 so as to control the operation of the component elements.

The etching amount calculating apparatus 25 irradiates laser light from the laser light source 26 toward the wafer W on the lower electrode 12 via the optical fiber 24, the collecting lens 23, and the monitor unit 21, and uses the detector 27 to receive superposed interference light resulting from superposition of reflected light from the wafer W, that is, trench interference light (interference light of reflected light from the mask film and reflected light from the bottom of the concave portion) and mask film interference light (other interference light) via the optical fiber 24 and the like. The superposed interference light received by the detector 27 is converted into an electric signal and transmitted to the computing unit 28.

The computing unit 28 calculates a superposed interference wave from the superposed interference light based on the received electric signal. The computing unit 28 also calculates the etching amount of the trench 132 by carrying out an etching amount calculating method in FIG. 6, described later, based on the calculated superposed interference wave.

Figure 2:
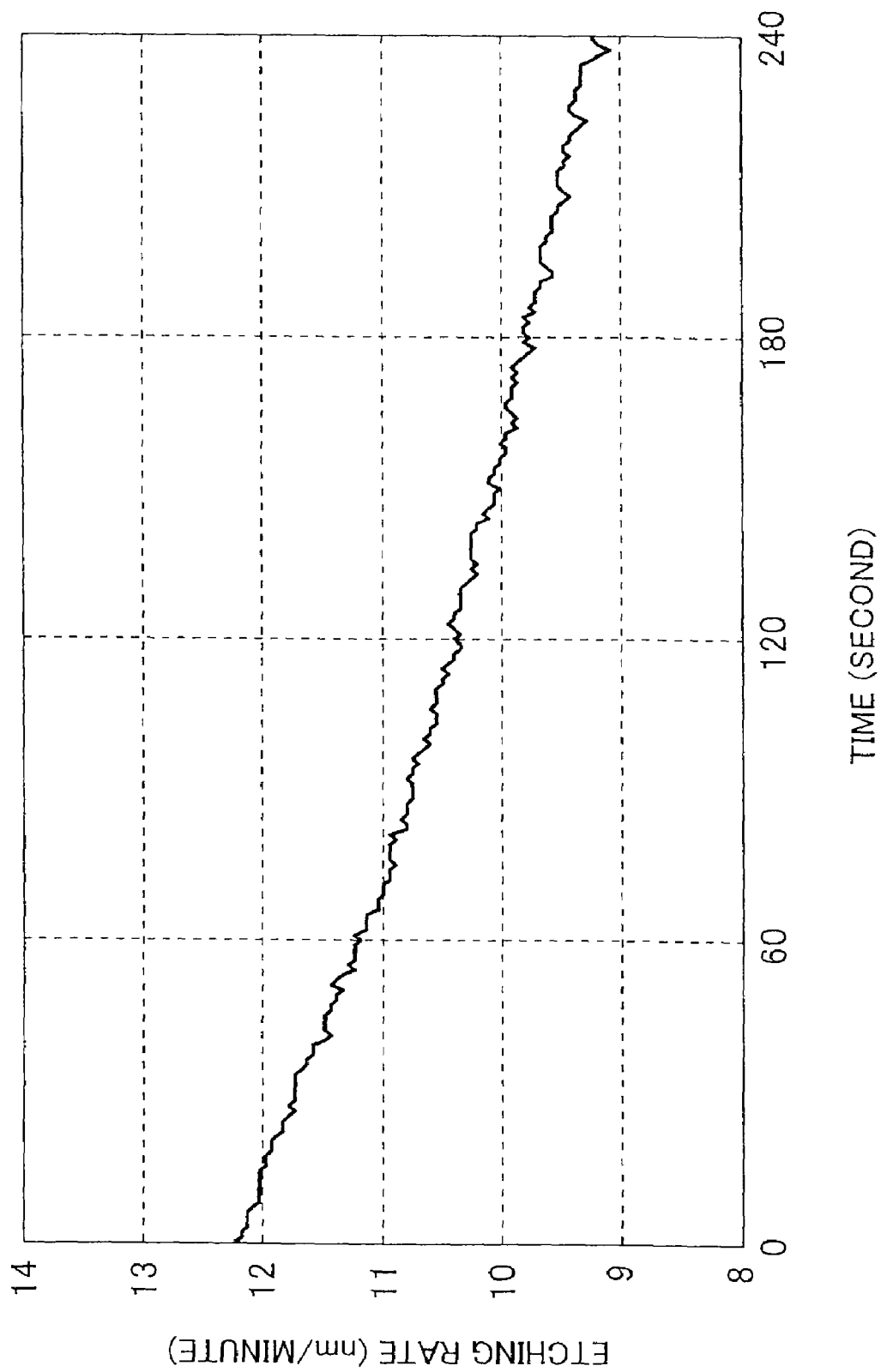
FIG. 2 is a diagram useful in explaining a decrease in etching rate in etching of a trench.

During etching, the etching rate is not fixed but changes due to various factors (such as changes in the pressure of the processing space S and fluctuations in high-frequency voltage). In particular, in the case of forming a trench having a high aspect ratio (for example, a deep trench) through etching, as the etching amount (etching depth) of the trench 132 is large, deposit becomes attached to the entrance of the trench 132 and inhibits the entry of plasma into the trench 132, causing a decrease in etching rate (see FIG. 2). Moreover, because the etching rate repeats tiny variations as shown in FIG. 2, the etching rate has to be calculated little by little so as to accurately calculate the etching amount of the trench 132.

In general, the etching rate can be calculated little by little during etching by differentiating the waveform of reflected light from the wafer at each timing. However, because the reflected light from the wafer W is the superposed interference light resulting from superposition of trench interference light and mask film interference light as described above, the etching rate of the trench 132 cannot be obtained with accuracy only by differentiating the waveform of the reflected light.

Thus, in the present embodiment, a frequency analysis is carried out to calculate the period of a trench interference wave from a superposed interference wave (hereinafter referred to as "trench interference period"). Moreover, in the frequency analysis, the use of not less than a predetermined data length, i.e. a data length of not less than one period of a waveform to be analyzed contributes to an improvement in the reliability of the frequency analysis, and hence in the present embodiment, to obtain the etching rate at a certain timing, a waveform in a predetermined time period is extracted from the superposed interference wave, and the frequency analysis of the extracted waveform is carried out. Also, as described above, because the etching rate is related to a trench interference period, in the present embodiment, a trench interference period is obtained first from the extracted waveform, and then the etching rate is calculated from the trench interference period.

Figure 3:
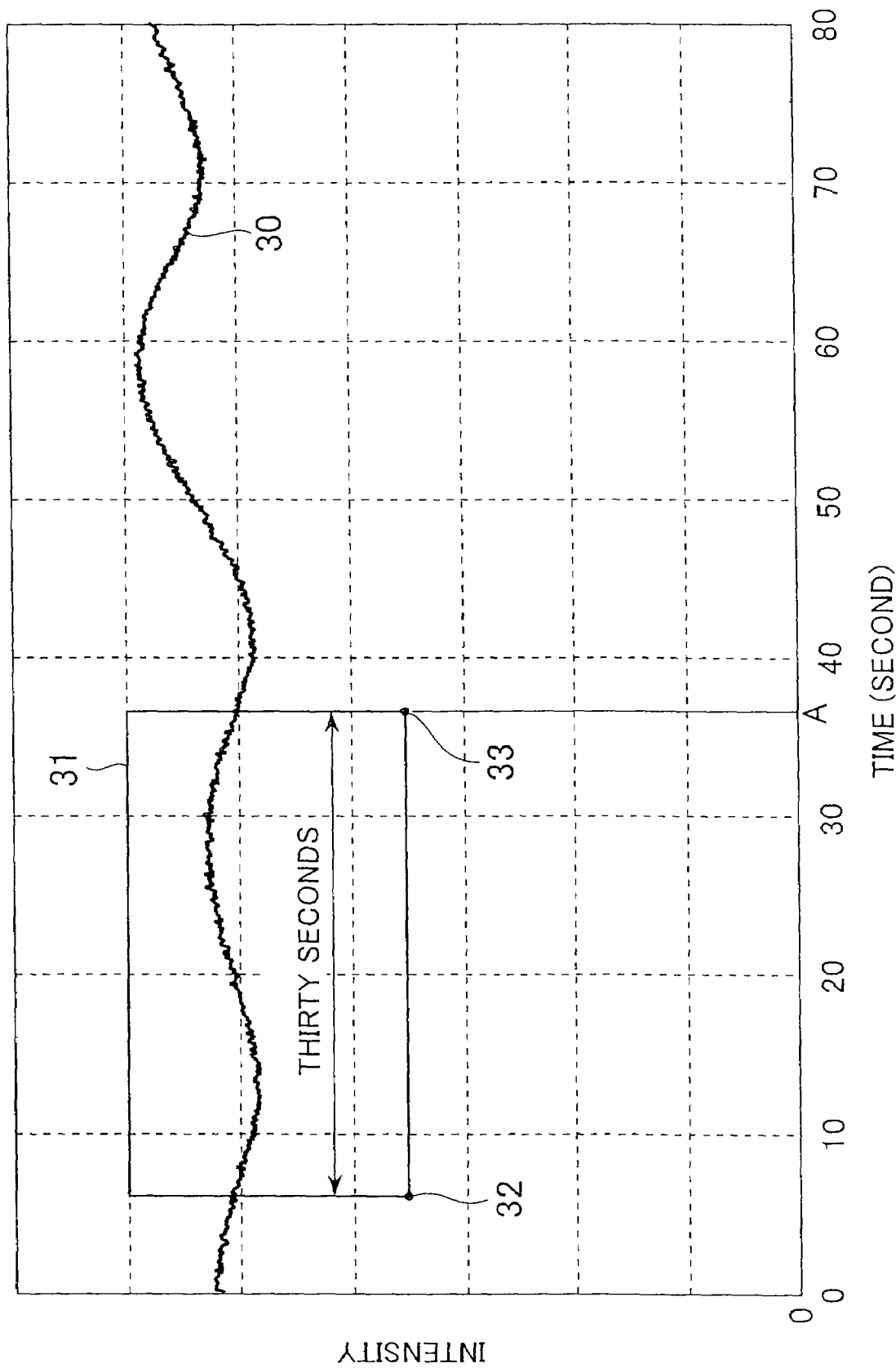
FIG. 3 is a diagram useful in explaining how a waveform is extracted from a superposed interference waveform in a predetermined time period in the etching amount calculating method according to the present embodiment.

FIG. 3 is a diagram useful in explaining how a waveform is extracted from a superposed interference wave in a predetermined time period in the etching amount calculating method according to the present embodiment.

Referring to FIG. 3, because the superposed interference wave 30 vibrates at intervals of about 30 seconds, the above-mentioned predetermined time period is set to 30 seconds. Here, to obtain the trench interference period at a timing A, a waveform (a waveform in a part enclosed by a rectangle in the figure) of the superposed interference wave 30 in a time period 31 from a timing 30 seconds before the timing A to the timing A is extracted. It should be noted that in the following description of the present embodiment, the above-mentioned predetermined time period will be referred to as the "window." The window 31 has a starting point 32 and an ending point 33; the starting point 32 corresponds to a time point 30 seconds before the timing A, and the ending point 33 corresponds to the timing A.

Then, in the present embodiment, a frequency analysis is carried out on the extracted waveform in the window 31. Here, because the extracted waveform corresponds to one period at the longest, a maximum entropy method is used as an analysis method. The maximum entropy method is a method in which the distribution of frequencies to be observed is calculated with a high resolution from the result of measurement in an extremely short measurement time period (see "Waveform Data Processing" (CQ Publishing Co., Ltd., the first edition published in Apr. 30, 1986)). This method does not require a large number of waveforms to be analyzed and is thus more suitable for the etching amount calculating method according to the present embodiment than a fast Fourier transformation method that requires waveforms of a large number of periods.

Figure 4:
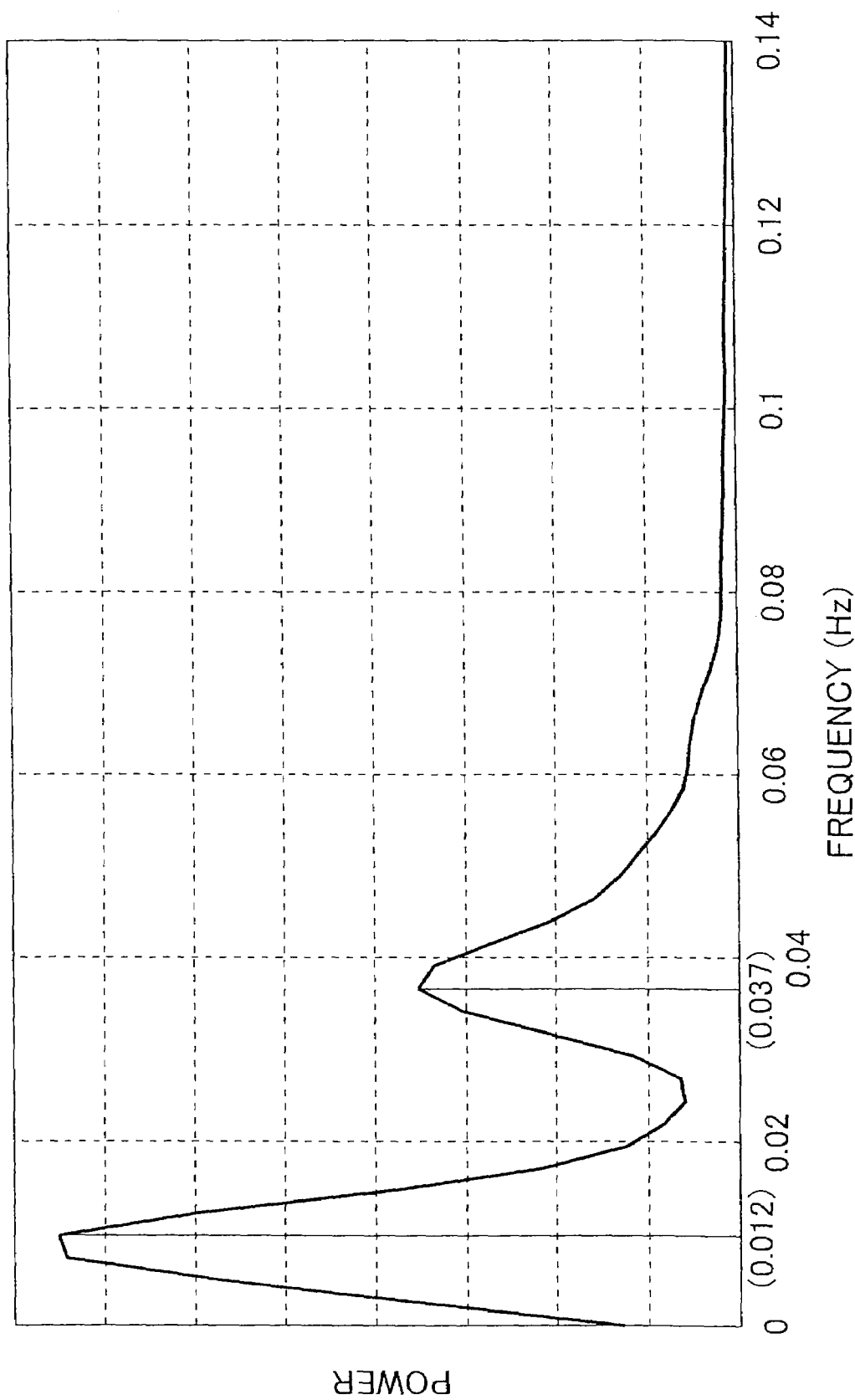
FIG. 4 is a diagram showing the distribution of frequencies obtained by a frequency analysis from a waveform in a window in FIG. 3 using a maximum entropy method.

FIG. 4 is a diagram showing the distribution of frequencies obtained by a frequency analysis from the waveform in the window shown in FIG. 3 using the maximum entropy method.

Because the superposed interference wave 30 includes mainly two waves consisting of a trench interference wave and a mask film interference wave, there are mainly two frequencies (about 0.012 Hz and about 0.037 Hz as viewed in FIG. 4) indicative of peaks as shown in FIG. 4. Here, because the trench interference wave has a shorter period (higher frequency) than the mask film interference wave as described above, the frequency of about 0.037 Hz corresponds to the trench interference period. Therefore, the frequency of about 0.037 Hz is detected as the trench interference period. Thus, in the present embodiment, because it is anticipated there are two peaks in the distribution of frequencies obtained by a frequency analysis, it is preferred that the trench interference period is estimated in advance prior to the frequency analysis, and the trench interference period is detected from the vicinity of the estimated trench interference period in the obtained distribution of frequencies.

Because the window 31 includes the waveform of the superposed interference wave 30 from the timing 30 seconds before the timing A to the timing A, the distribution of frequencies shown in FIG. 4 is the distribution of frequencies of the superposed interference wave 30 from the timing 30 seconds before the timing A to the timing A. Thus, the trench interference period detected from the distribution of frequencies shown in FIG. 4 is the average period of trench interference light in the superposed interference wave 30 from the timing 30 seconds before the timing A to the timing A, but in the present embodiment, for the convenience of explanation, the trench interference period detected from the distribution of frequencies shown in FIG. 4 is regarded as the trench interference period at the timing A. It should be noted that in the present embodiment, as will be described later, a plurality of windows are set for the superposed interference wave 30, and trench interference periods obtained from the distributions of frequencies in the respective windows are integrated and averaged to obtain the overall average value of the trench interference periods. For this reason, adverse effects caused by regarding the average period of the trench interference light in the window 31 as the trench interference period at the timing A can be eliminated.

Moreover, in the etching amount calculating method according to the present embodiment, the average value of etching rates in the whole time period from the time at which the first predetermined time period (corresponding to the window 31 of which starting point 32 corresponds to the start of etching, and ending point 33 corresponds to the time at which 30 seconds has elapsed after the start of etching) has elapsed to the timing in which the etching amount is calculated is calculated, and the etching amount is calculated from the average value of the etching rates.

Figure 5:
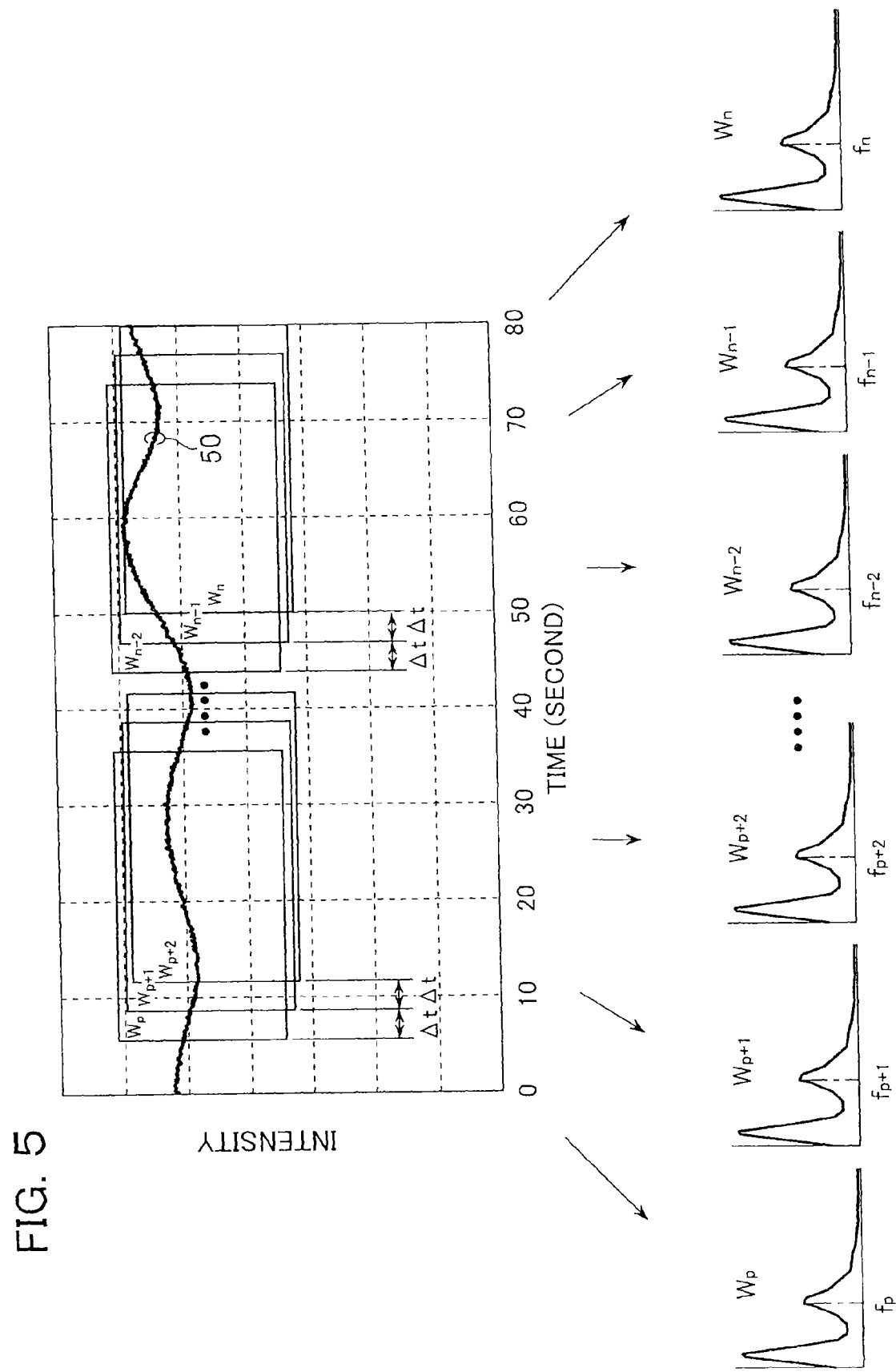
FIG. 5 is a diagram useful in explaining how to calculate the average value of etching rates in the etching amount calculating method according to the present embodiment.

FIG. 5 is a diagram useful in explaining how to calculate the average value of etching rates in the etching amount calculating method according to the present embodiment, and shows the case where 80 seconds has elapsed after the start of etching.

Referring to FIG. 5, n windows $W_k$ (k=1 to n; n is a natural number) which are shifted by $\Delta t$ (predetermined time period) are set for a superposed interference wave 50, the distributions of frequencies in the respective windows $W_k$ are obtained, and n trench interference periods $f_k$ (k=1 to n; n is a natural number) are detected from the respective distributions of frequencies.

Then, the n trench interference periods $f_k$ are integrated and averaged according to the following equation (1):

$$f_{ave} = \sum_{k=1}^{n} f_k / n \qquad (1)$$

The trench interference period $f_{ave}$ is calculated as the average value of a trench interference wave until the time when 80 seconds have elapsed after the start of etching. Further, the average value of etching rates to the timing 80 seconds after the start of etching is calculated according to the following equation (2) where the measured wavelength (the wavelength of laser light from the laser light source 26) is $\lambda$:

$$\text{Average value of etching rates} = f_{ave} \times \lambda / 2 \qquad (2)$$

Then, the etching amount until the time when 80 seconds have elapsed after the start of etching is calculated according to the following equation (3):

$$\text{Etching amount} = \text{average value of etching rates} \times \text{etching time} \qquad (3)$$

In the etching amount calculating method according to the present embodiment, if a disturbance is added to the superposed interference wave 50 in a certain window $W_t$ (t is any of natural numbers 1 to n), a trench interference period $f_t$ obtained from the window $W_t$ is an abnormal value, but the trench interference period $f_t$ and a trench interference period $f_u$ (u is any of 1 to n and a natural number other than t) obtained from another window $W_u$ are integrated and averaged, and hence the effect of the trench interference period $f_t$ on the trench interference period $f_{ave}$ is small.

Next, a description will be given of the etching amount calculating method according to the present embodiment.

Figure 6:
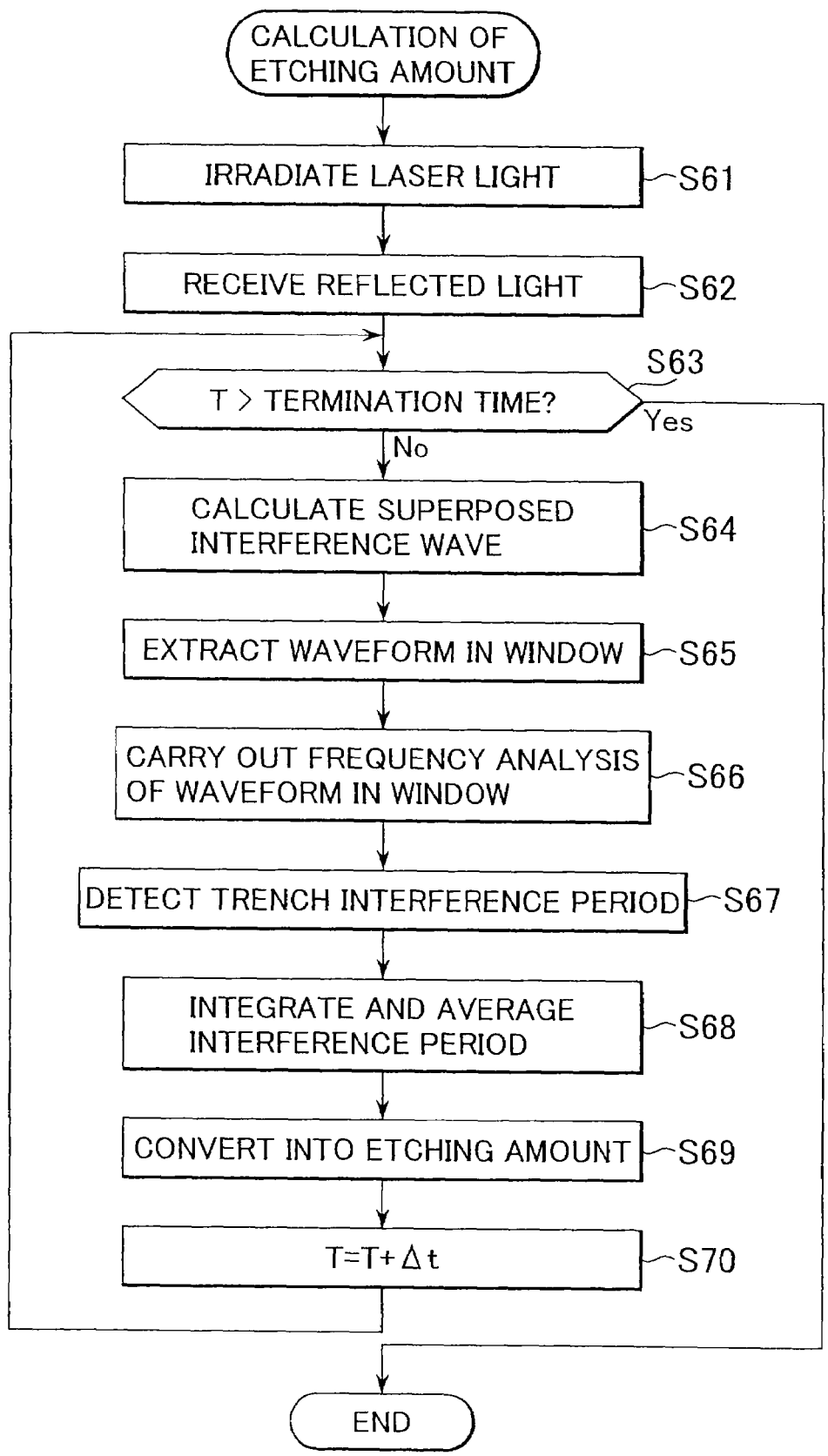
FIG. 6 is a flow chart showing the etching amount calculating method according to the present embodiment.

FIG. 6 is a flow chart showing the etching amount calculating method according to the present embodiment.

Referring to FIG. 6, first, after the substrate processing apparatus 10 starts etching the to-be-etched layer 130 of the wafer W, the laser light source 26 irradiates laser light L1 toward the wafer W via the optical fiber 24, the collecting lens 23, and the monitor unit 21 (step S61) (irradiating step), and the detector 27 receives superposed interference light as reflected light from the wafer W via the optical fiber 24 and the like (step S62) (light receiving step).

Then, in a step S63, the computing unit 28 determines whether or not the present timing T has passed the etching termination time set in advance, and if the present timing T has passed the etching termination time (YES to the step S63), the process is brought to an end, and if the present timing T has not yet passed the etching termination time (NO to the step S63), the computing unit 28 calculates (updates) a superposed interference wave from the etching starting time to the present timing T based on the superposed interference light received by the detector 27 (step S64) (interference wave calculating step).

Next, the computing unit 28 extracts a waveform in a window of which ending point is the present timing T (step S65) (waveform extracting step), and carries out a frequency analysis of the extracted waveform in the window using the maximum entropy method (step S66) (frequency analyzing step). Here, the time period from the starting point to the ending point of the window is set to be longer than one period of the mask film interference wave.

Thereafter, the computing unit 28 detects a frequency indicative of a peak in the vicinity of a trench interference period estimated in advance as a trench interference period at the present timing T in the distribution of frequencies obtained by the frequency analysis (step S67) (interference period detecting step).

Then, the computing unit 28 integrates and averages the trench interference period at the timing T, which is detected this time, and trench interference periods detected from the lapse of the first predetermined time period to the present timing T using the above equation (1) (step S68) (integrating and averaging step), and converts the integrated and averaged trench interference period into the etching amount of the trench 132 using the above equations (2) and (3) based on the measured wavelength from the start of etching to the present timing T and the etching time period (time period from the start of etching to the present timing T) (step S69) (etching amount calculating step).

Thereafter, the computing unit 28 adds Δt to the present timing T so as to update the present timing T. That is, the ending point of the window is shifted by Δt (step S70), and the process returns to the step S63.

In the etching amount calculating method according to the present embodiment, the calculation of a superposed interference wave, the extraction of a waveform in a window from the superposed interference wave, the frequency analysis, and the detection of a trench interference period at the present timing T are repeated while shifting the ending point of each window by Δt, and a trench interference period at the present timing T detected at each repetition and trench interference periods detected at respective timings from the lapse of the first predetermined time period to the present timing T are integrated and averaged, and the resulting trench interference period is converted into the etching amount of the trench 132. Thus, even if a disturbance is added to a detected waveform in a certain window, a trench interference period that is an abnormal value obtained from the certain window and trench interference periods obtained from other windows are integrated and averaged, and hence the effect of the trench interference period that is the abnormal value on the integrated and averaged trench interference period can be made small, and hence even if a disturbance is added, the etching amount of the trench 132 can be stably and accurately calculated.

Moreover, in the etching amount calculating method according to the present embodiment, because the time period from the starting point to the ending point of the window is longer than one period of the superposed interference wave calculated in the step S64, the reliability of the frequency analysis of the superposed interference wave in the window can be improved.

Moreover, in the etching amount calculating method according to the present embodiment, because the maximum entropy method is used for the frequency analysis, the reliability of the frequency analysis can be improved even if the number of waveforms in windows is small.

Moreover, in the etching amount calculating method according to the present embodiment, because the trench interference period is estimated in advance, and the trench interference period at the present timing T is detected from the vicinity of the estimated trench interference period in the distribution of frequencies obtained by the frequency analysis, the trench interference period can be quickly detected, and an abnormal value can be prevented from being detected as the trench interference period.

Next, a description will be given of an etching amount calculating method according to a second embodiment of the present invention.

The present embodiment is basically the same as the above described first embodiment in terms of construction and operation, and thus features of the construction and operation that are the same as in the first embodiment will thus not be described, only features that are different from those of the first embodiment being described below.

Figure 7:
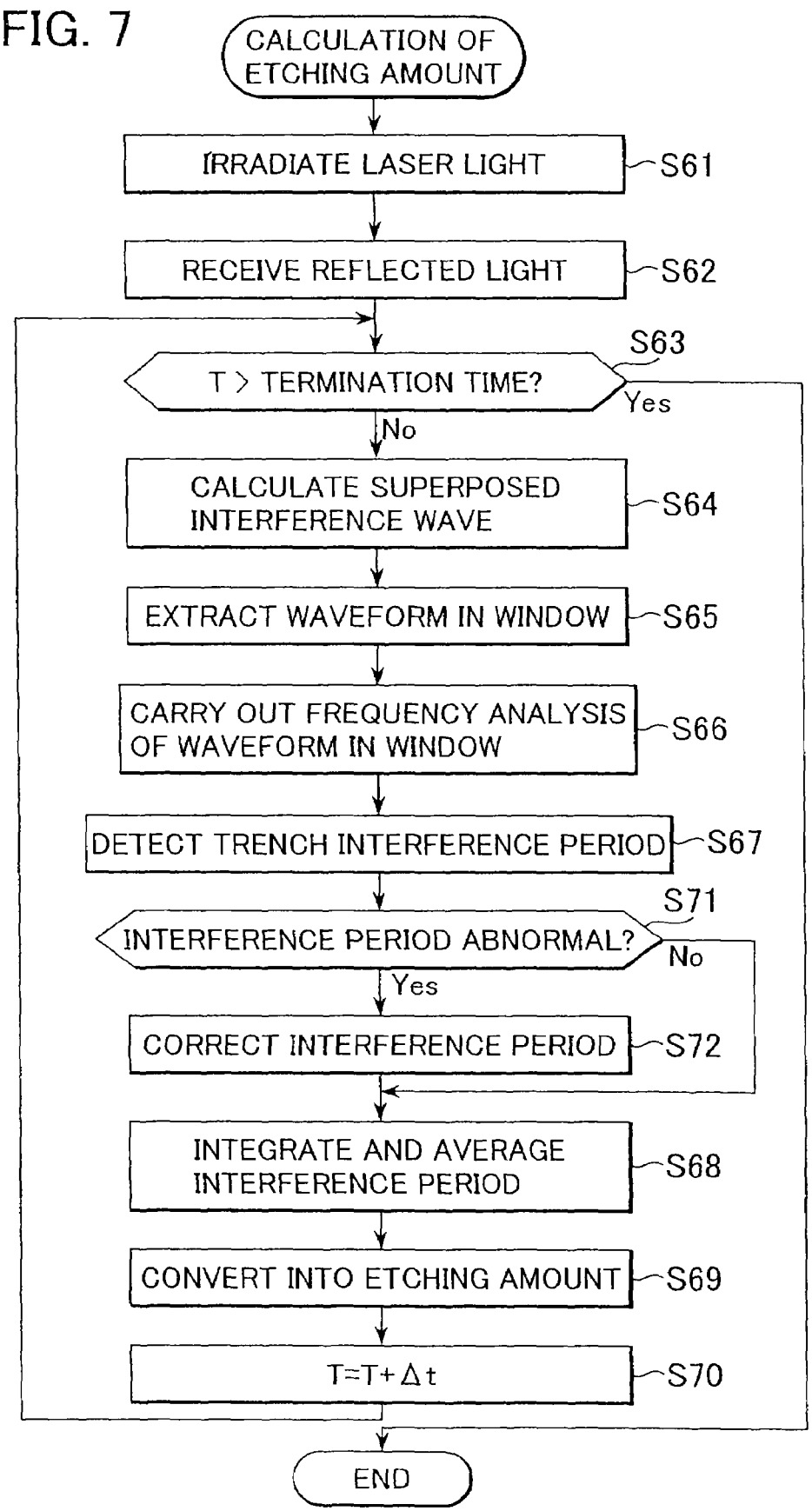
FIG. 7 is a flow chart showing an etching amount calculating method according to a second embodiment of the present invention.

FIG. 7 is a flow chart showing the etching amount calculating method according to the present embodiment.

Referring to FIG. 7, first, the steps S61 to S67 are executed, and then in a step S71, the computing unit 28 determines whether or not a trench interference period detected as a trench interference period at the present timing T corresponds to an abnormal value (for example, the maximum frequency or the minimum frequency in the distribution of frequencies obtained in the step S66).

As a result of the determination in the step S71, if the trench interference period detected as the trench interference period at the present timing T does not correspond to an abnormal value (NO to the step S71), the process directly proceeds to the step S68, and if the trench interference period detected as the trench interference period in the present timing T corresponds to an abnormal value (YES to the step S71), the trench interference period detected as the trench interference period in the present timing T is removed, and a trench interference period detected from a window corresponding to timing one timing before the present timing T is set as the trench interference period at the present timing T so as to correct the trench interference period (step S72) (interference period correcting step).

Next, the computing unit 28 executes the steps S68 to S70.

In the etching amount calculating method according to the present embodiment, if a trench interference period detected as a trench interference period at the present timing T corresponds to an abnormal value, the detected trench interference period is removed, and a trench interference period detected from a window corresponding to timing one timing before the present timing T is set as a trench interference period at the timing T, and therefore, the effect of the trench interference period that is the abnormal value on the integrated and averaged trench interference periods can be made small, and hence even if a disturbance is added, the etching amount of the trench 132 can be stably and accurately calculated.

Although in the etching amount calculating method according to the above described present embodiment, if a detected trench interference period corresponds to an abnormal value, a trench interference period detected from a window corresponding to timing one timing before the present timing T is set as a trench interference period at the timing T, a trench interference period detected from a window corresponding to timing one timing after the present timing T may be set as a trench interference period at the timing T.

Next, a description will be given of an etching amount calculating method according to a third embodiment of the present invention.

The present embodiment is basically the same as the above described first embodiment in terms of construction and operation and differs from the above described first embodiment only in that preprocessing is carried out before a frequency analysis of an extracted waveform in a window is carried out, and features of the construction and operation that are the same as in the first embodiment will thus not be described, only features that are different from those of the first embodiment being described below.

If the percentage of an opening portion of the trench 132 that occupies the surface of the wafer W is small (hereinafter refereed to as the "opening rate"), for example, less than 0.5%, the absolute light quantity of the reflected light $L_4$ from the bottom of the trench 132 is small, and hence the percentage of the part of which the trench interference light occupies the superposed interference light received by the detector 27 is small.

Figure 9:
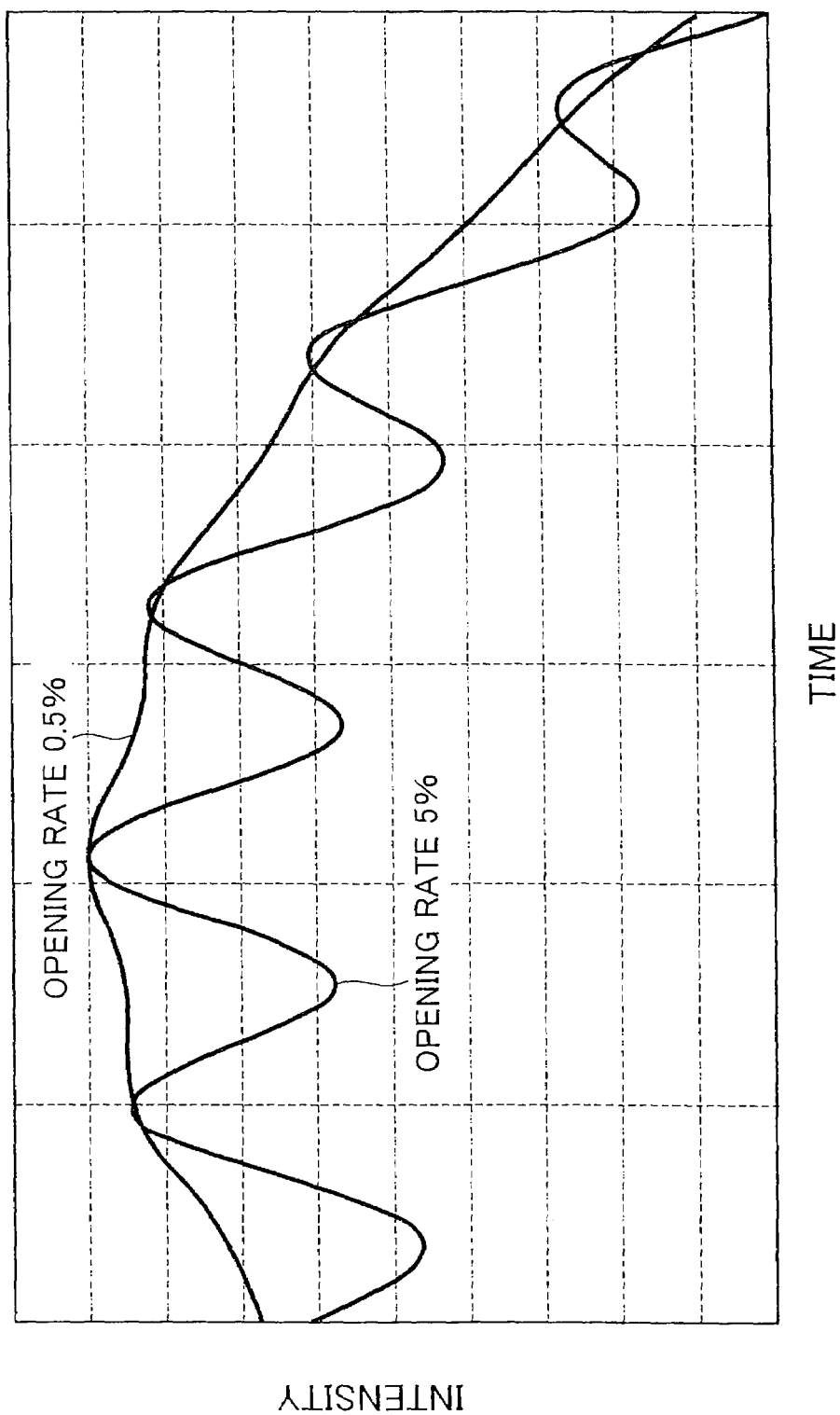
FIG. 9 is a diagram showing changes in part of a superposed interference wave in the case where the opening rate is changed.

FIG. 9 is a diagram showing changes in a part of a superposed interference wave in the case where the opening rate is changed.

As is clear from FIG. 9, if the opening rate is 5%, two kinds of interference waves (a mask interference wave and a trench interference wave) are superposed in the superposed interference wave, but if the opening rate is 0.5%, the absolute light quantity of the reflected light $L_4$ is small, and hence almost no waveform of the trench interference wave appears in the superposed interference wave. Such a phenomenon may also occur in the case where the percentage of an opening portion of a hole on the surface of the wafer W is small or in the case where the aspect ratio of a trench (or a hole) is large (if the trench 132 is a deep trench) because the absolute light quantity of reflected light from the trench or the hole is small.

In the case where almost no waveform of the trench interference wave appears in the superposed interference wave (i.e. the opening rate is 0.5%), a waveform in the window 31 is extracted from the superposed interference wave, and the extracted waveform is subjected as it is to a frequency analysis. In the distribution of frequencies obtained by the frequency analysis, the peak of the period of the trench interference wave (trench interference period) is small.

Figure 10:
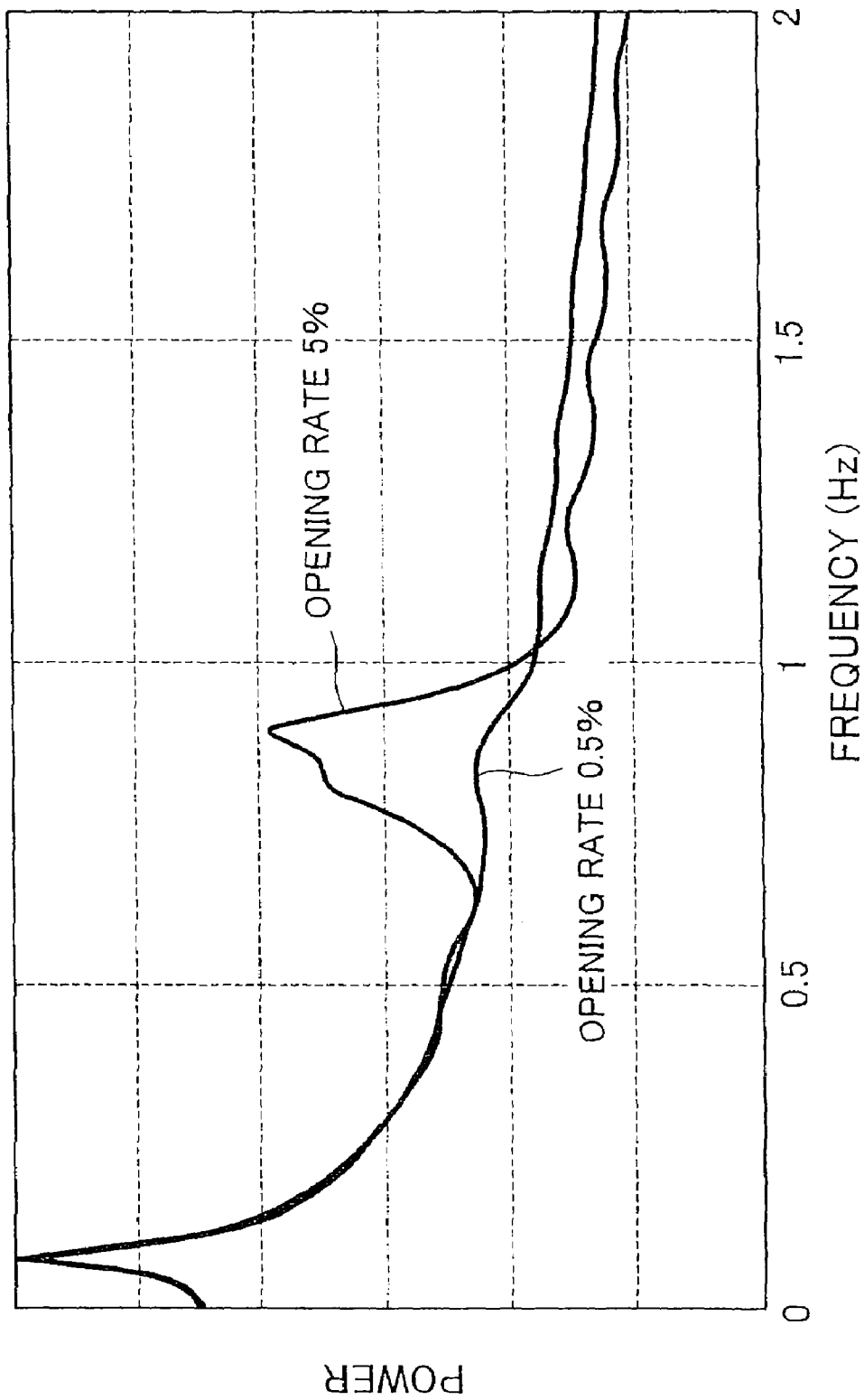
FIG. 10 is a diagram showing changes in the distribution of frequencies of waveforms in a window in the case where the opening rate is changed.

FIG. 10 is a diagram showing changes in the distribution of frequencies of a waveform in a window in the case where the opening rate is changed.

As shown in FIG. 10, if the opening rate is 5%, two peaks (the period of the trench interference wave (about 0.8 Hz) and the period of the mask film interference wave (about 0.1 Hz)) clearly appear in the distribution of frequencies, but if the opening rate is 0.5%, only one peak (the period of the mask film interference wave) appears in the distribution of frequencies, and almost no period of the trench interference wave appears in the distribution of frequencies. As a result, the trench interference period cannot be accurately detected, and the etch rate cannot be accurately calculated.

To cope with this, in the present embodiment, almost all of a part occupied by the mask film interference wave is removed from the superposed interference wave before a frequency analysis of the waveform in the window 31 extracted from the superposed interference wave is carried out.

Figure 11:
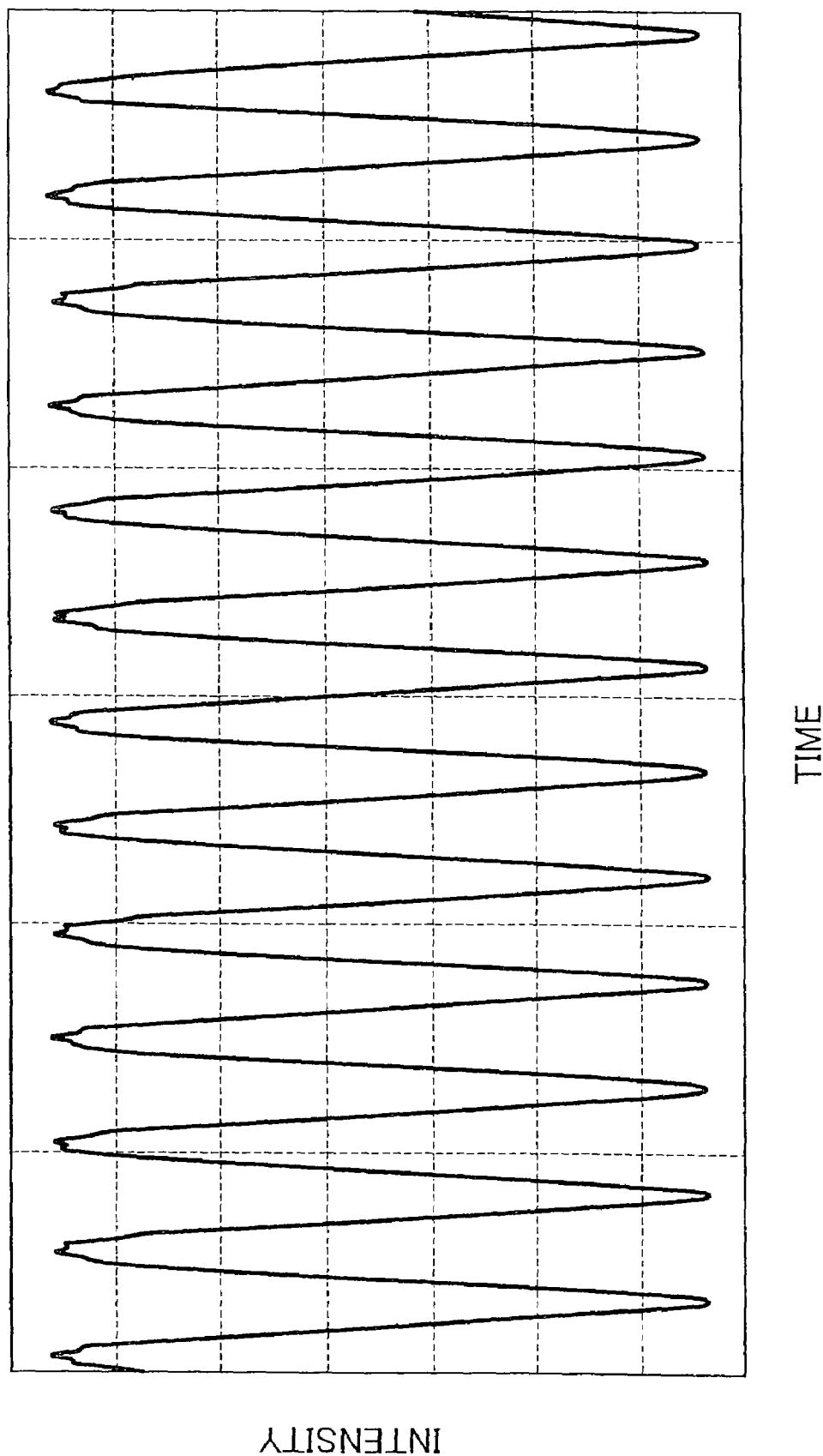
FIG. 11 is a diagram showing a superposed interference wave in the case where the opening rate is 0.5%.

FIG. 11 is a diagram showing a superposed interference wave in the case where the opening rate is 0.5%.

As shown in FIG. 11, if the opening rate is 0.5%, almost no trench interference wave with a short period appears in the superposed interference wave, and hence the superposed interference wave is substantially occupied by the mask film interference wave. Thus, a waveform obtained by approximating the superposed interference wave is substantially the same as the waveform of the mask film interference wave. Thus, in the present embodiment, the waveform obtained by approximating the superposed interference wave is removed from the superposed interference wave. As a result, almost all of a part occupied by the mask film interference wave can be removed from the superposed interference wave.

Moreover, as shown in FIG. 11, the superposed interference wave that is substantially occupied by the mask film interference wave is close to a sine wave, and a part of the sine wave with a ¼ period or less can be approximated with accuracy by a quadratic polynomial. Thus, in the present embodiment, when a waveform in the window 31 is to be extracted from the superposed interference wave, a part of the mask film interference wave with a ¼ period or less is extracted.

Figure 12:
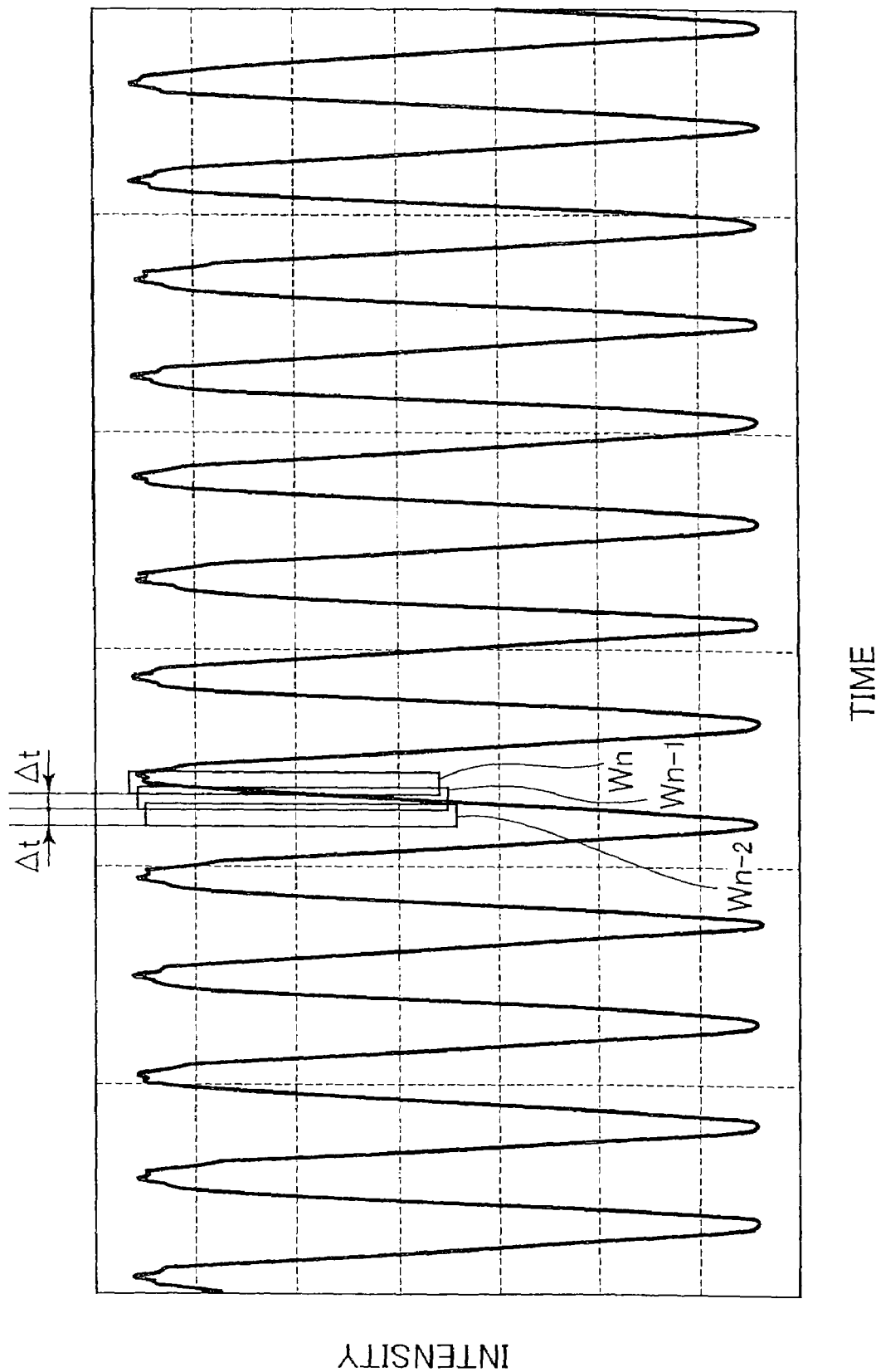
FIG. 12 is a diagram useful in explaining how waveforms in windows are extracted in the etching amount calculating method according to a third embodiment of the present invention.
Figure 13:
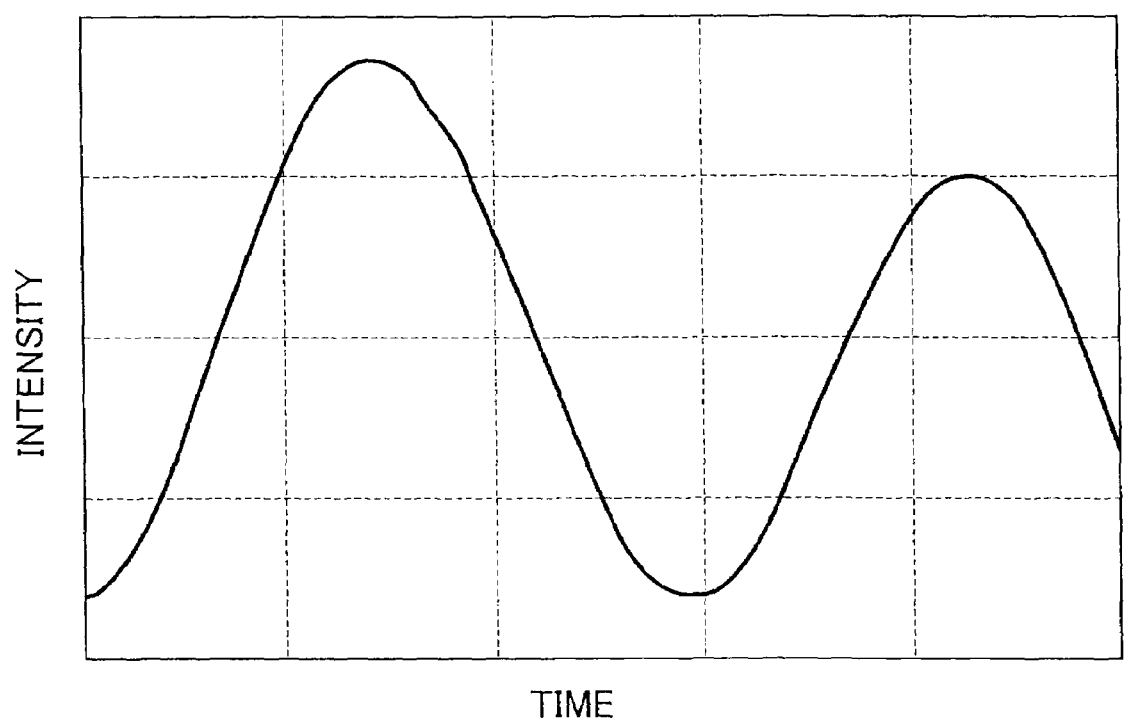
FIG. 13 is a diagram showing a waveform obtained by removing almost all of a part occupied by mask film interference waves from a superposed interference wave.
Figure 14:
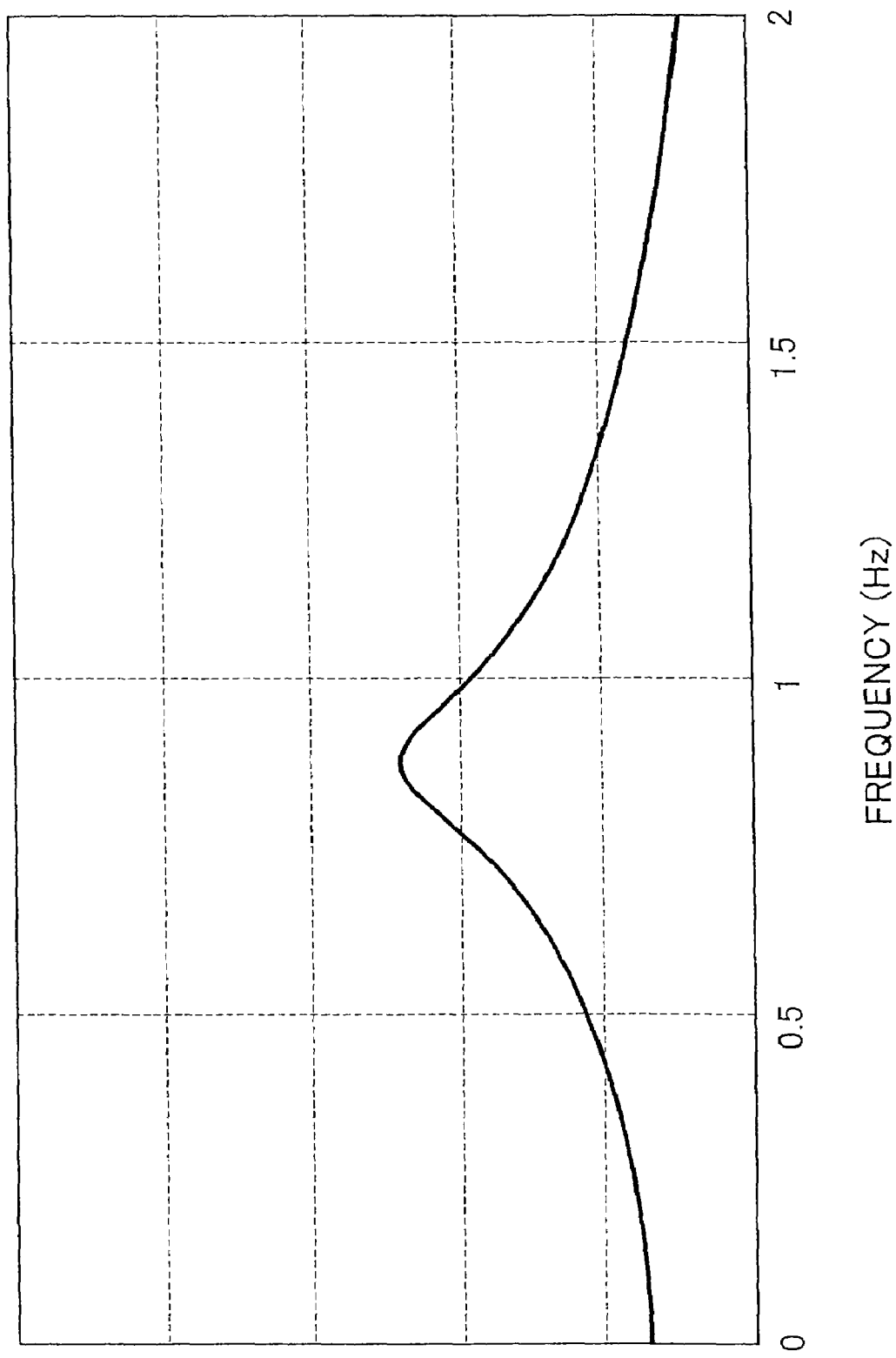
FIG. 14 is a diagram showing the distribution of frequencies obtained by a frequency analysis from a waveform obtained by removing almost all of a part occupied by mask film interference waves from a superposed interference wave.

Specifically, in the present embodiment, as shown in FIG. 12, n windows $W_k$ (k=1 to n; n is a natural number) corresponding to a ¼ period or less of the mask film interference wave are set while shifting them by $\Delta t$, waveforms in the respective windows $W_k$ are extracted, waveforms obtained by approximating the respective extracted waveforms by a quadratic polynomial are removed from the respective extracted waveforms to obtain a waveform from which almost all of the part occupied by the mask film interference wave has been removed (see FIG. 13), and a frequency analysis of a waveform obtained after the removal is carried out. As a result, the distribution of frequencies in which the peak of the trench interference period (about 0.8 Hz) clearly appears can be obtained as shown in FIG. 14. It should be noted that the reason why the peak of the period of the mask film interference wave (about 0.1 Hz) does not appear in the distribution of frequencies in FIG. 14 is that almost all of the part occupied by the mask film interference wave has been removed from the windows $W_k$.

Figure 15:
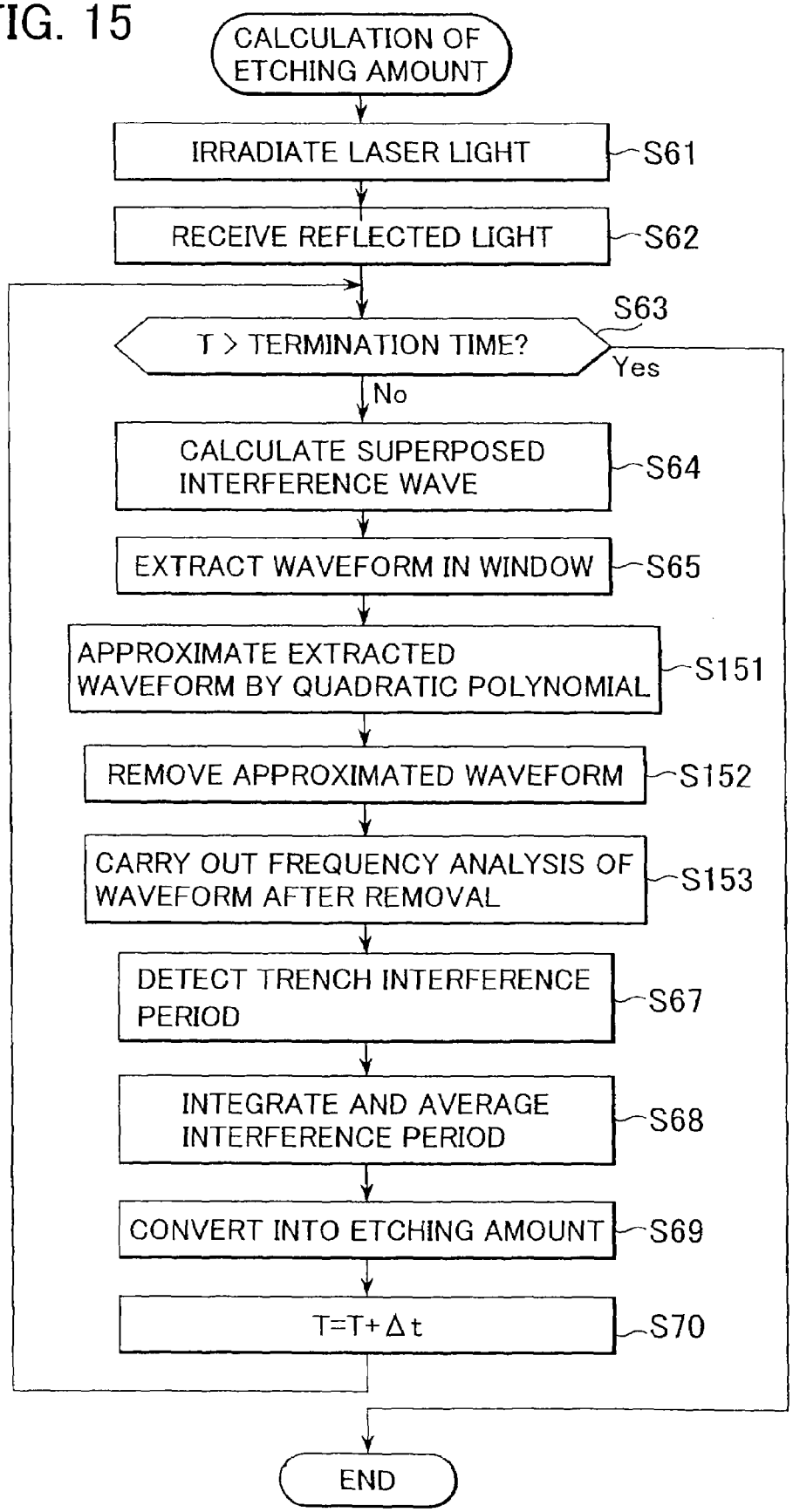
FIG. 15 is a flow chart showing an etching amount calculating method according to the present embodiment.

FIG. 15 is a flow chart showing an etching amount calculating method according to the present embodiment. It should be noted that the etching amount calculating method according to the present embodiment is executed in the case where the opening rate is small, for example, less than 0.5%.

Referring to FIG. 15, first, the steps S61 to S64 are executed, and then the computing unit 28 extracts a part with a ¼ period or less of which present timing T is an ending point from a superposed interference wave as a waveform in a window (step S65) (waveform extracting step).

Then, the computing unit 28 calculates a waveform by approximating the extracted waveform in the window by a quadratic polynomial (hereinafter referred to merely as the "approximate waveform") (step S151), removes the calculated approximate waveform from the extracted waveform in the window (step S152) (pre-analysis processing step) to obtain a waveform from which almost all of the part occupied by the mask film interference wave has been removed, and carries out a frequency analysis of the waveform after the removal of the approximate waveform (step S153).

Then, the computing unit 28 executes the steps S67 to S70.

In the etching amount calculating method according to the present embodiment, almost all of the part occupied by the mask film interference wave is removed from the extracted waveform in the window prior to the frequency analysis, and hence even if the opening rate is small, for example, less than 0.5%, the percentage of the part occupied by the trench interference wave in the waveform after the removal of the approximate waveform can be increased, so that the distribution of frequencies in which the peak of the trench interference period clearly appears can be obtained by the frequency analysis. As a result, the period of the trench interference wave can be accurately calculated. It should be noted that the etching amount calculating method according to the present embodiment can be used only in the case where the period of the waveform of the mask film interference light is longer than the period of the waveform of the trench interference light.

In the etching amount calculating method according to the present embodiment, prior to the frequency analysis, a waveform in a window is extracted, and a waveform obtained by approximating the extracted waveform in the window by a quadratic polynomial (approximate waveform) is removed from the extracted waveform in the window. If the opening rate is small, the waveform of the superposed interference wave is substantially the same as the mask film interference wave, and hence the approximate waveform is also the same as the mask film interference wave. Thus, almost all of the part occupied by the mask film interference wave can be reliably removed from the extracted waveform in the window.

Moreover, in the etching amount calculating method according to the present embodiment, part of the mask film interference wave with a ¼ period or less is extracted as a waveform in a window. The mask film interference wave that occupies almost all of the superposed interference wave is close to a sine wave, and hence if part of the mask film interference wave with a ¼ period or less are extracted, the extracted waveform in the window can be accurately approximated. As a result, almost all of the part occupied by the mask film interference wave can be reliably removed from the extracted waveform in the window.

It should be noted that the case where the opening rate is small corresponds to not only the case where the percentage of the opening of the trench 132 in the surface of the waver W is small, but also the case where the percentage of the opening of a hole on the surface of the wafer W is small or the case where the aspect ratio of a trench (or a hole) is high.

Although in the above described embodiments, the maximum entropy method is used for the frequency analysis, a fast Fourier transformation method may be used in the case where the number of interference waveforms in respective windows is large. Because only a small number of calculations are required in the fast Fourier transformation method, the etching amount of the trench 132 can be calculated more quickly.

Figure 8:
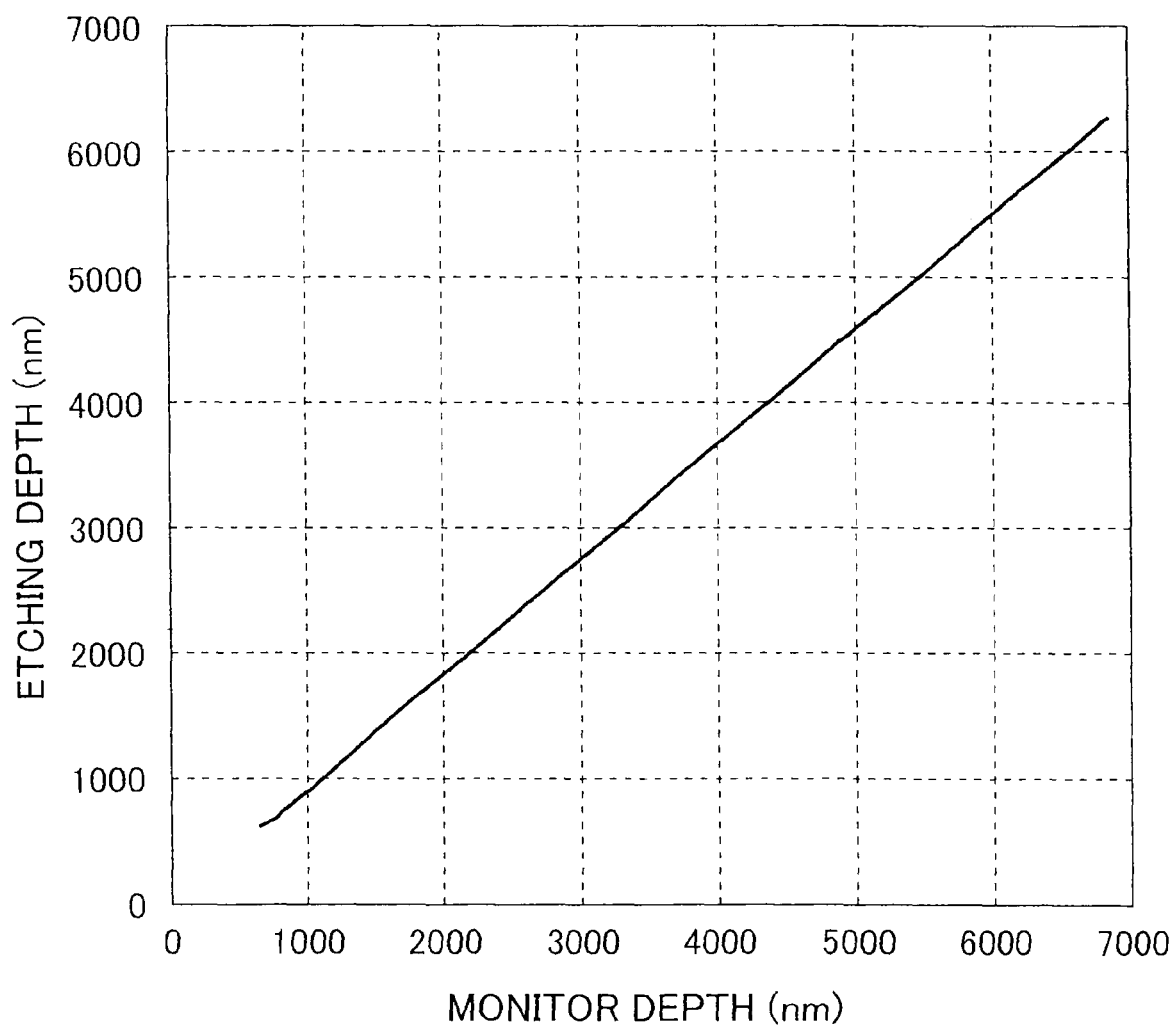
FIG. 8 is a diagram showing errors between calculated etching amounts and measured etching amounts.

Moreover, in the case where the etching amount (etching depth) of a certain trench is calculated using any of the etching amount calculation methods described above, if the mask film 131 is a film of the kind that allows laser light to pass through, there may be an error between the calculated etching amount ("monitor depth" in the figure) and the measured etching amount ("etching depth" in the figure) as shown in FIG. 8. It can be considered that this is because the superposed interference light does not mainly includes interference light of the reflected light $L_2$ and the reflected light $L_4$, but includes interference light of the reflected light $L_3$ and the reflected light $L_4$, and hence not only a change in the thickness of the mask film 131 but also the refractive index of the mask film 131 affects a change in the optical path length of the reflected light $L_3$.

In the case where there is an error between the calculated etching amount and the measured etching amount, it is preferred that prior to calculation of the etching amount, the etching amount (etching rate) of the trench 132 is measured using a test wafer W, the etching amount of the trench 132 is calculated using any of the etching amount calculating methods of the above described embodiments, and a regression equation or the like of the measured etching amount and the calculated etching amount is obtained. Then, in the subsequent etching, the etching amount of the trench 132 is calculated using any of the etching amount calculating methods described above, and then the calculating etching amount is corrected using the regression equation.

Although in the above described embodiments, the etching amount of the trench 132 is calculated, the etching amount of a hole may be calculated using any of the etching amount calculating methods in FIGS. 6, 7, and 15.

Moreover, it is to be understood that the present invention may also be accomplished by supplying to a storage medium in which is stored a program code of software that realizes the functions of any of the above described embodiments, and then causing a computer (for example, the controller 29) to read out and execute the program code stored in the storage medium.

In this case, the program code itself read out from the storage medium realizes the functions of any of the above described embodiments, and hence the program code and the storage medium in which the program code is stored constitute the present invention.

The storage medium used for supplying the program code may be that capable of storing the program code, for example, a RAM, a NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW or a DVD+RW), a magnetic tape, a non-volatile memory card, or a ROM. Alternatively, the program code may be supplied to a computer by downloading the program code from another computer, a database, etc., not shown, connected to the Internet, a commercial network, a local area network, or the like.

Moreover, it is to be understood that the functions of any of the above described embodiments can be accomplished not only by executing a program code read out by the computer, but also by causing an OS (operating system) or the like which operates on the CPU to perform a part or all of the actual operations based on instructions of the program code.

Furthermore, it is to be understood that the functions of any of the above described embodiments can also be accomplished by writing a program code read out from a storage medium into a memory provided on a function expansion board inserted into the computer or in a function expansion unit connected to the computer and then causing a CPU or the like provided on the function expansion board or in the function expansion unit to perform a part or all of the actual operations based on instructions of the program code.

Further, the form of the above program code may be an object code, a program code executed by an interpreter, or script data supplied to an OS.

Next, a description will be given of examples of the present invention.

Example 1

First, a wafer W on which a mask film 131 that is formed of an oxide film and allows laser light L1 to pass through is formed on a to-be-etched layer 130 formed of silicon was prepared, and a deep trench 132 was formed in the to-be-etched layer 130 through etching using the substrate processing apparatus 10. The etching conditions were as follows:
Actual etching rate: 1200 nm/min.
Selection ratio: 10:1 (the to-be-etched layer 130 versus the mask film 131)
Opening ratio: 0.05
Measured wavelength (wavelength of laser light L1): 300 nm
Sampling rate: 10 Hz In etching of the deep trench 132, the time period from the starting point and the ending point of a window was set to 30 seconds, the etching amount calculating method in FIG. 6 was executed to obtain trench interference periods at respective timings, the trench interference periods were integrated and averaged, and the etching rates of the deep trench 132 at respective timings were obtained from the integrated and averaged trench interference periods. Then, the obtained etching rates were graphed (see FIG. 16).

Comparative Example 1

In etching of the deep trench 132 described above, a superposed interference wave from a wafer W was observed using the detector 27, interference waves with short periods in the superposed interference wave were read, trench interference periods were obtained from time periods between extreme values of the interference waves with the short periods, and the etching rates of the deep trench 132 between the extreme values were obtained from the trench interference periods. Then, the obtained etching rates were graphed (see FIG. 16).

Figure 16:
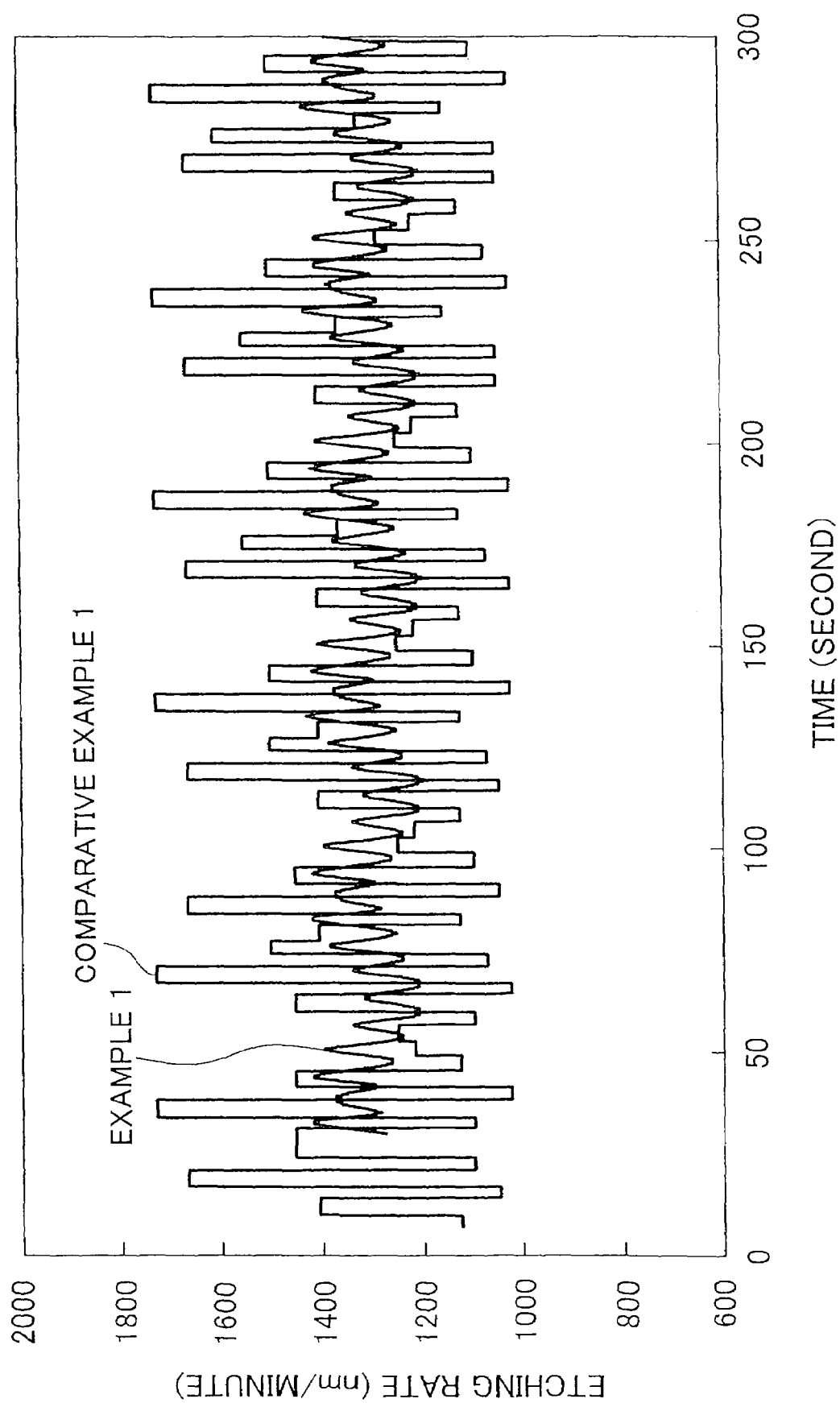
FIG. 16 is a comparative diagram showing the etching rate calculated by the etching amount calculating method in FIG. 6 and the etching rate obtained from the time period between extreme values of an interference wave.

As is clear from the graph of FIG. 16, the etching rate of the example 1 varies to a smaller degree and is more stable than the etching rate of the comparative example 1.

Figure 17:
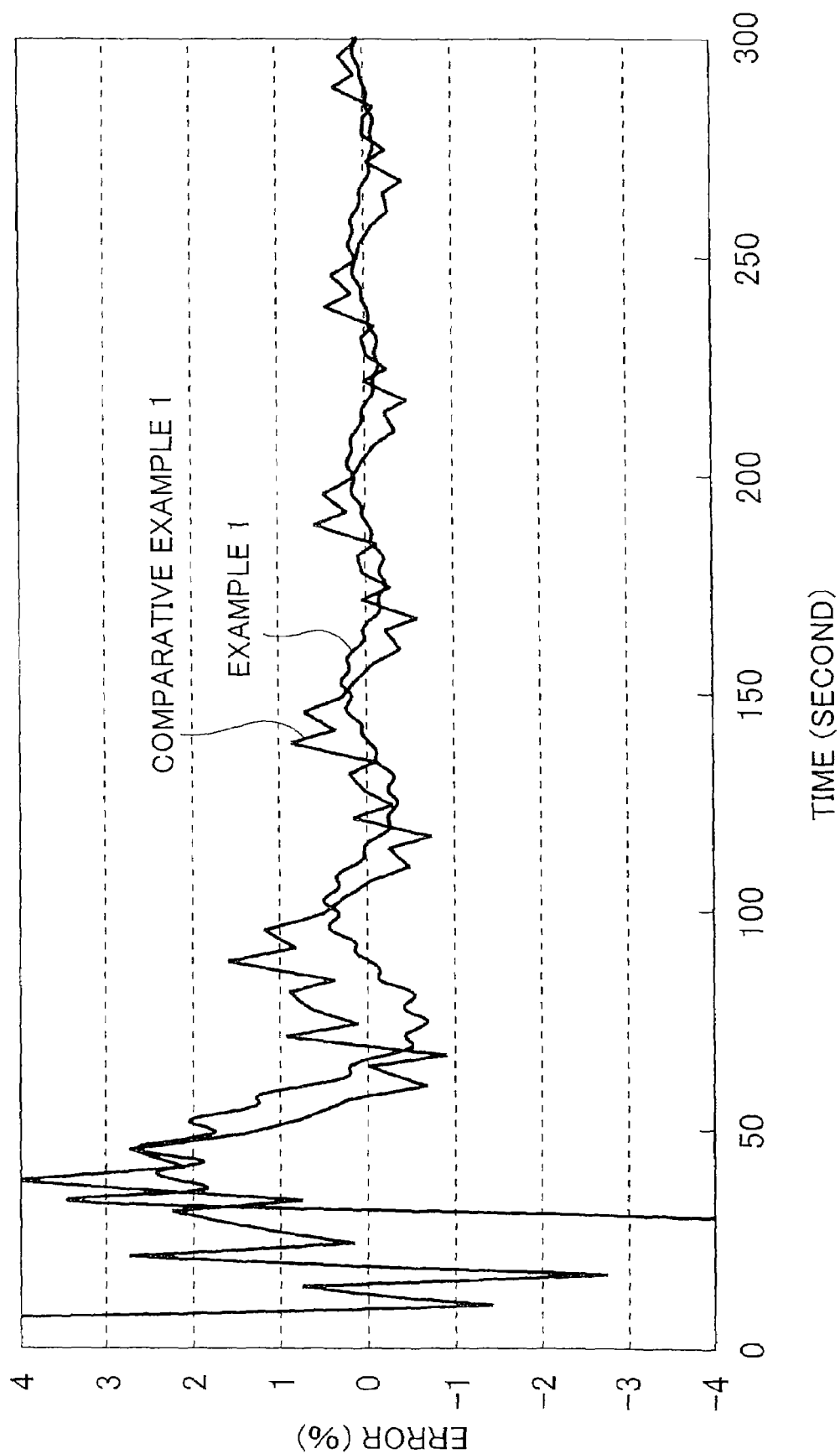
FIG. 17 is a comparative diagram showing the error between the etching amount calculated by the etching amount calculating method in FIG. 6 and the actual etching amount and the error between the etching amount obtained from the time period between extreme values of an interference wave and the actual etching amount.

Further, errors in the etching amount of the example 1 and errors in the etching amount of the comparative example 1 were graphed in chronological order (see FIG. 17).

As is clear from the graph of FIG. 17, errors in the etching amount of the example 1 are smaller than errors in the etching amount of the comparative example 1. It was thus found that the etching amount can be accurately calculated using the etching amount calculating method in FIG. 6.

Example 2

Next, a wafer W on which a mask film 131 formed of an oxide film was formed on a to-be-etched layer 130 formed of silicon was prepared, and a shallow trench 132 was formed in the to-be-etched layer 130 through etching using the substrate processing apparatus 10. The etching conditions were as follows.
Actual etching rate: 360 nm/min.
Selection ratio: 10:1 (the to-be-etched layer 130 versus the mask film 131)
Opening rate: 0.2
Measured wavelength (wavelength of laser light L1): 300 nm
Sampling rate: 10 Hz In etching of the shallow trench 132, the time period from the starting point and the ending point of a window was set to 25 seconds, the etching amount calculating method in FIG. 6 was executed to calculate the etching amount (etching depth) of the shallow trench 132 at respective timings. Then, the calculated etching rates were graphed (see FIG. 18).

Comparative Example 2

In etching of the shallow trench 132 described above, a superposed interference wave from the wafer W was observed using the detector 27, the distribution of frequencies was obtained from the entire superposed interference wave from the start of etching to the respective timings by a frequency analysis, trench interference periods from the start of the etching to respective timings were obtained based on the distribution of frequencies to calculate the etching amounts (etching depths) of the shallow trench 132 at the respective timings from the trench interference periods. That is, the etching amounts were calculated from the superposed interference wave without using a window appearing in FIG. 3. Then, the calculated etching amounts were graphed (see FIG. 18).

Figure 18:
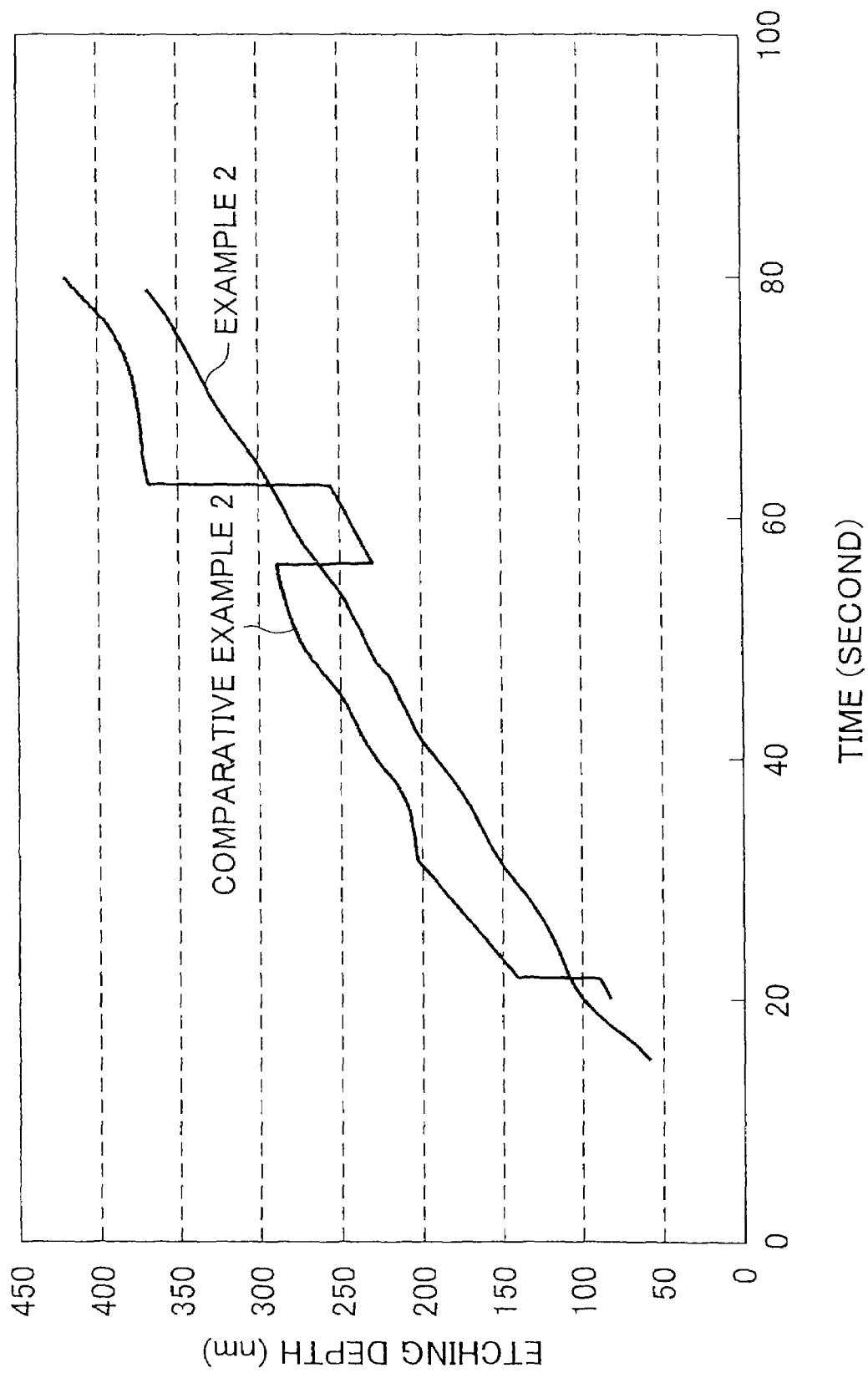
FIG. 18 is a comparative diagram showing the etching amount calculated by the etching amount calculating method in FIG. 6 and the etching amount obtained by a frequency analysis of a superposed interference wave from the start of etching to each timing.

Referring to the graph of FIG. 18, the etching amount data in the comparative example 2 fluctuates, and it can be considered that this is because a disturbance is added to the superposed interference wave. On the other hand, the etching amount data in the example 2 does not fluctuate. The etching amounts in the example 2 and the comparative example 2 are etching amounts obtained from the same superposed interference wave to which a disturbance has been added, and thus it can be found that the etching amount can be accurately calculated in a stable manner using the etching amount calculating method in FIG. 6 even if a disturbance is added to the superposed interference wave.

Example 3

In etching of a trench 132 in a wafer W other than the wafers W used in the examples 1 and 2 described above, the etching amount calculating method in FIG. 6 was executed to obtain the etching rate of the trench 132 at each timing. The obtained etching rates were then graphed (see FIG. 19).

Comparative Example 3

Moreover, in the same etching as in the example 3, an etching amount calculating method, of which conditions were the same as that of the etching amount calculating method in FIG. 6 except that the fast Fourier transformation method, not the maximum entropy method, was used, was executed to obtain the etching rates of the trench 132 at the respective timings. The obtained etching rates were then graphed (see FIG. 19).

Figure 19:
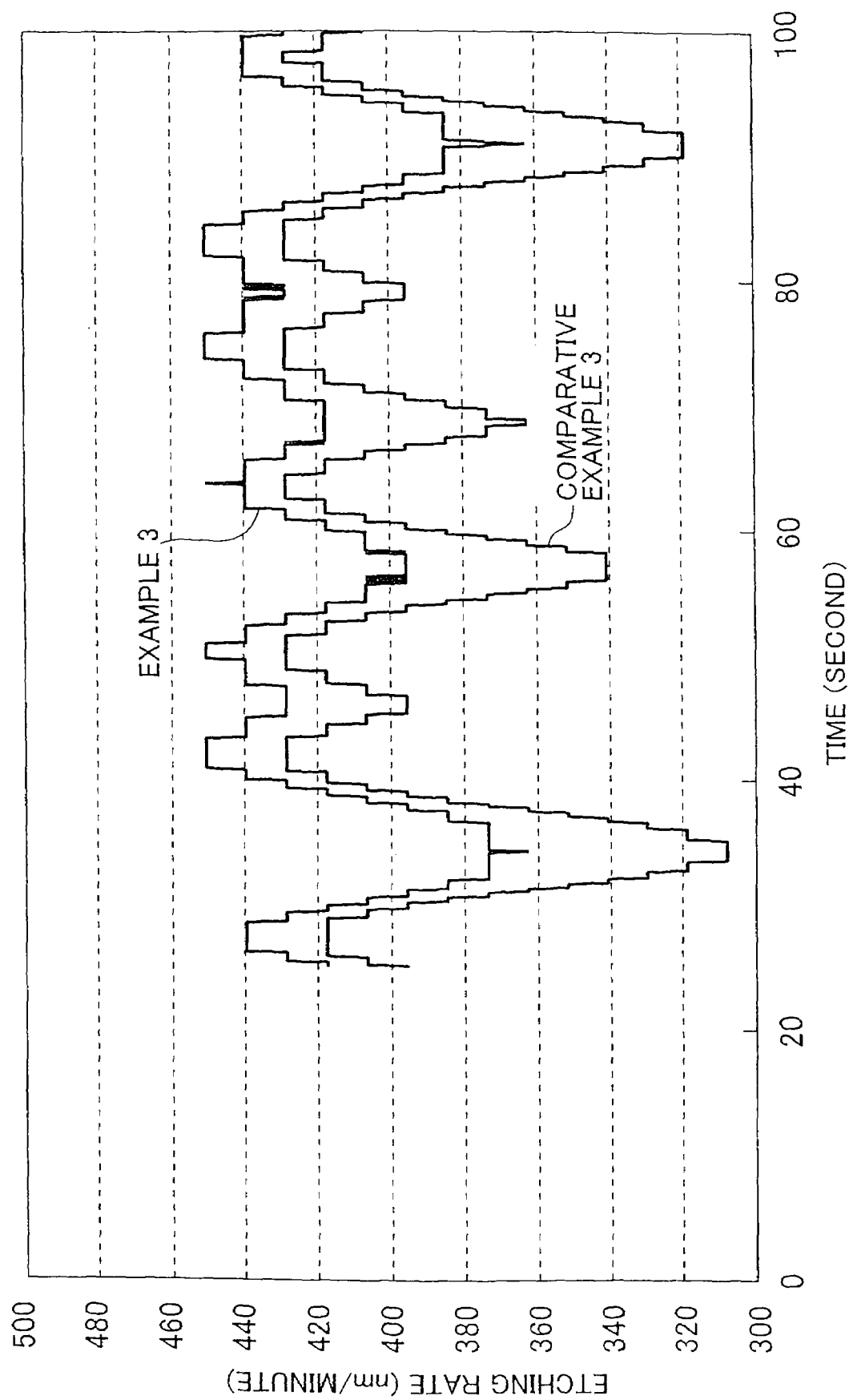
FIG. 19 is a comparative diagram showing the etching amount calculated using a maximum entropy method and the etching rate calculated using a fast Fourier transformation method.

As is clear from the graph of FIG. 19, the etching rate in the example 3 varies to a smaller degree and is more stable than the etching rate in the comparative example 3. It was thus found that the etching amount can be calculated in a stable manner if the maximum entropy method is used.

Example 4

First, a wafer W with an opening rate of 5% and a wafer W with an opening rate of 0.5% were prepared, and in etching of a to-be-etched layer 130 of each wafer W, the etching amount calculating method in FIG. 15 was executed to obtain the etching rates of the respective wafers W. The obtained etching rates were then graphed (see FIG. 20).

Comparative Example 4

As is the case with the example 4, a wafer W with an opening rate of 5% and a wafer W with an opening rate of 0.5% were prepared, and in etching of a to-be-etched layer 130 of each wafer W, the etching amount calculating method in FIG. 6 was executed to obtain the etching rates of the respective wafers W. The obtained etching rates were then graphed (see FIG. 21).

Figure 20:
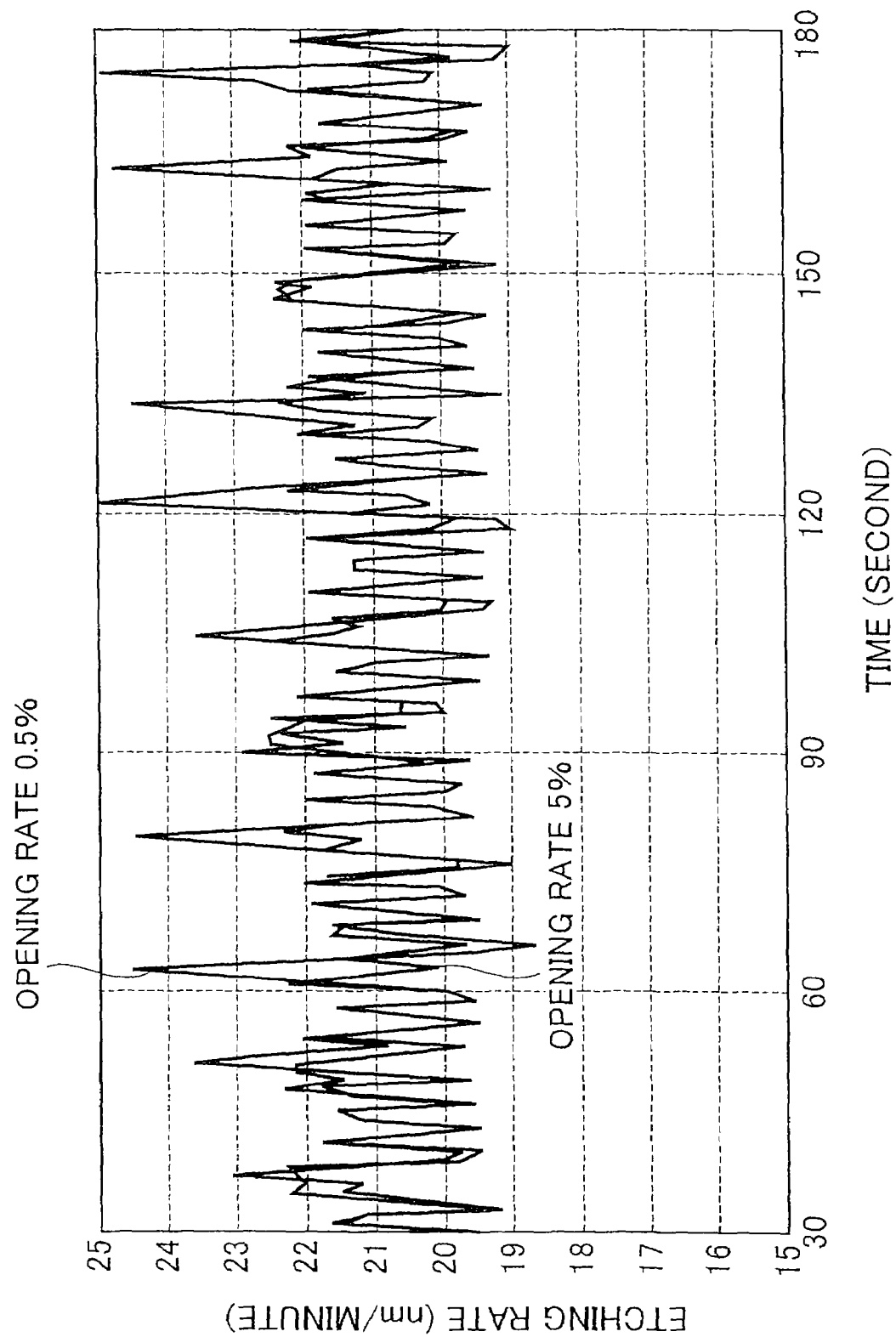
FIG. 20 is a diagram showing etching rates of wafers having different opening rates obtained using the etching amount calculating method in FIG. 15.
Figure 21:
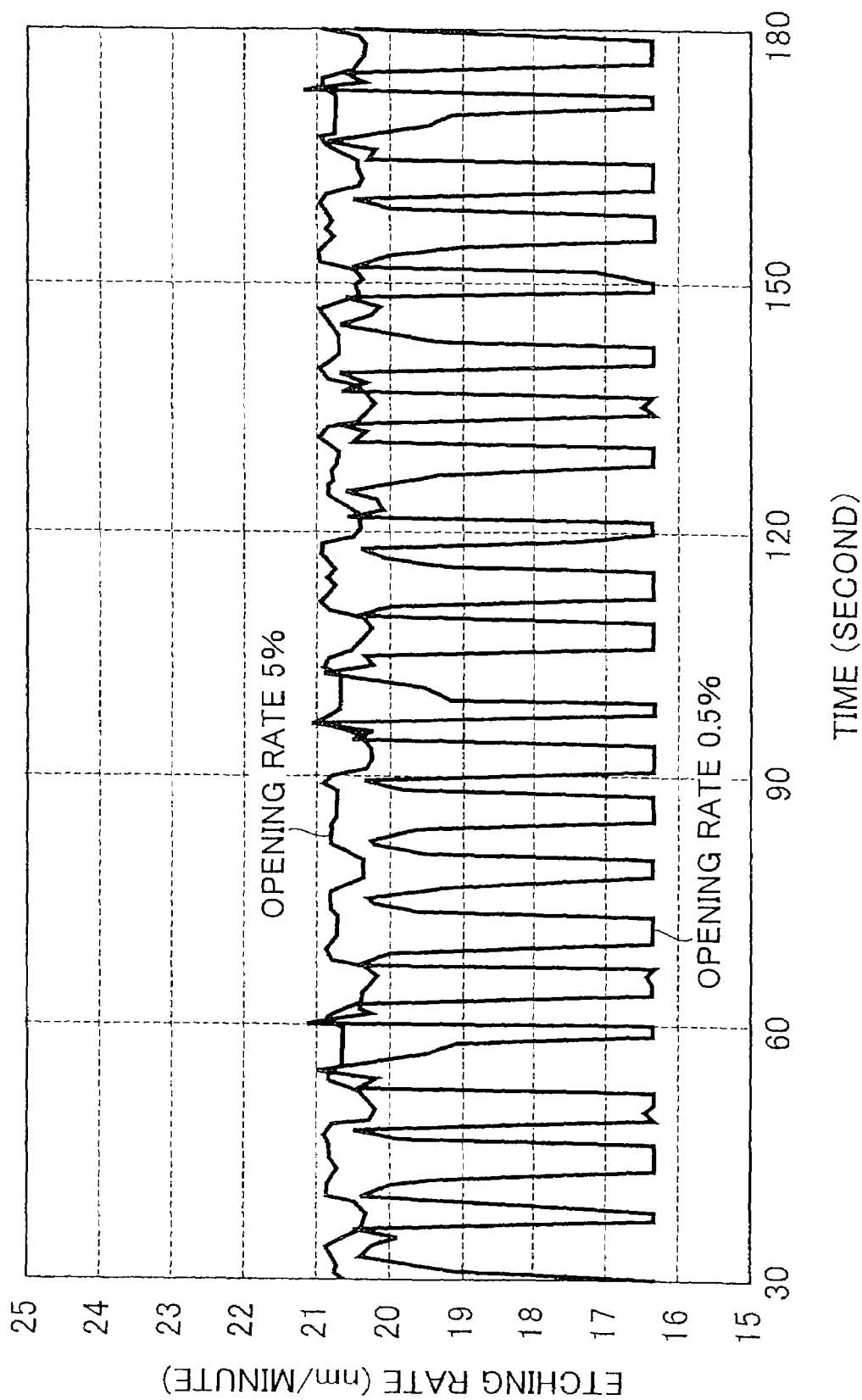
FIG. 21 is a diagram showing etching rates of wafers having different opening rates obtained using the etching amount calculating method in FIG. 6.
Figure 22:
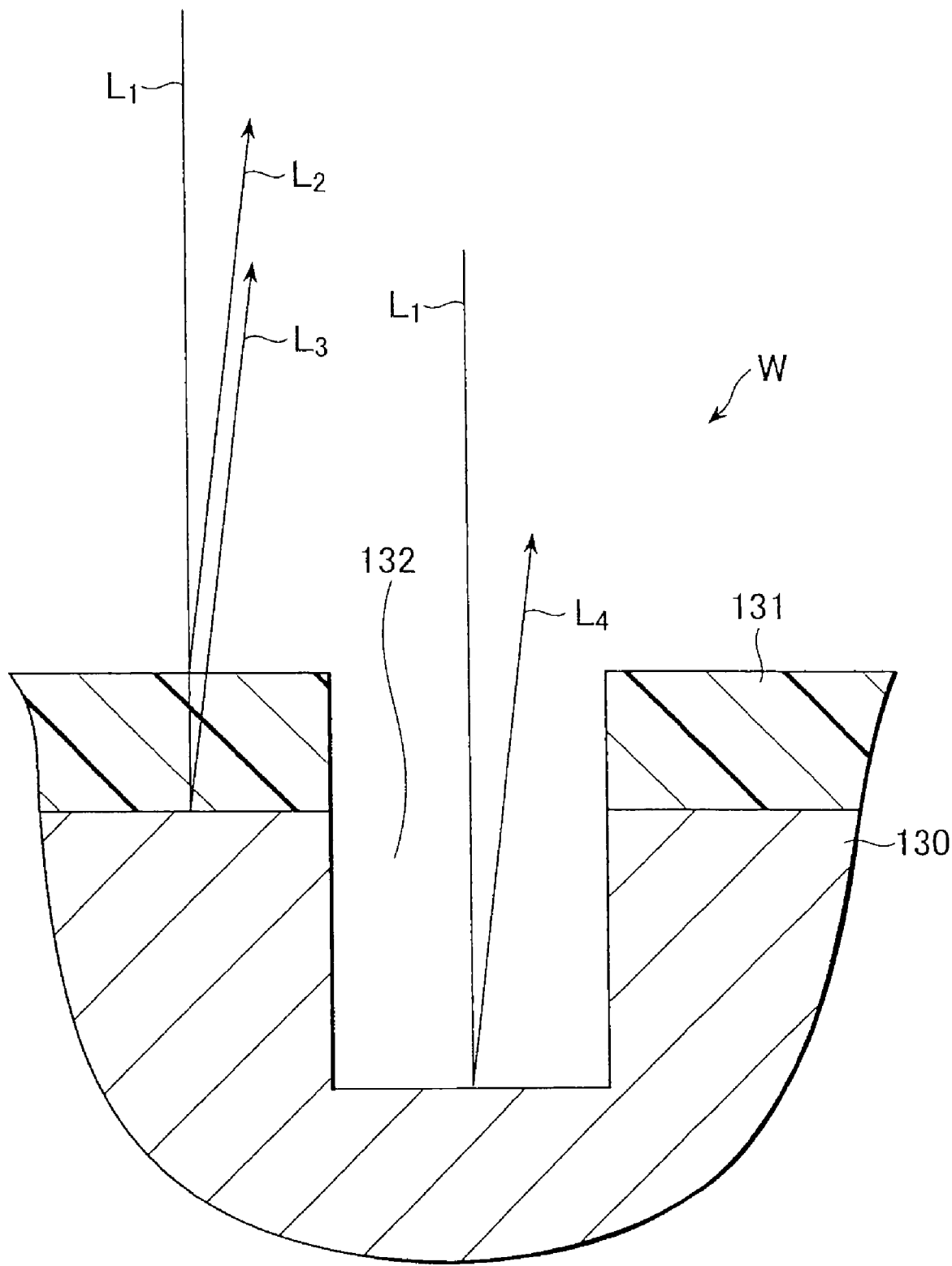
FIG. 22 is a view useful in explaining light interference during etching.
Figure 23:
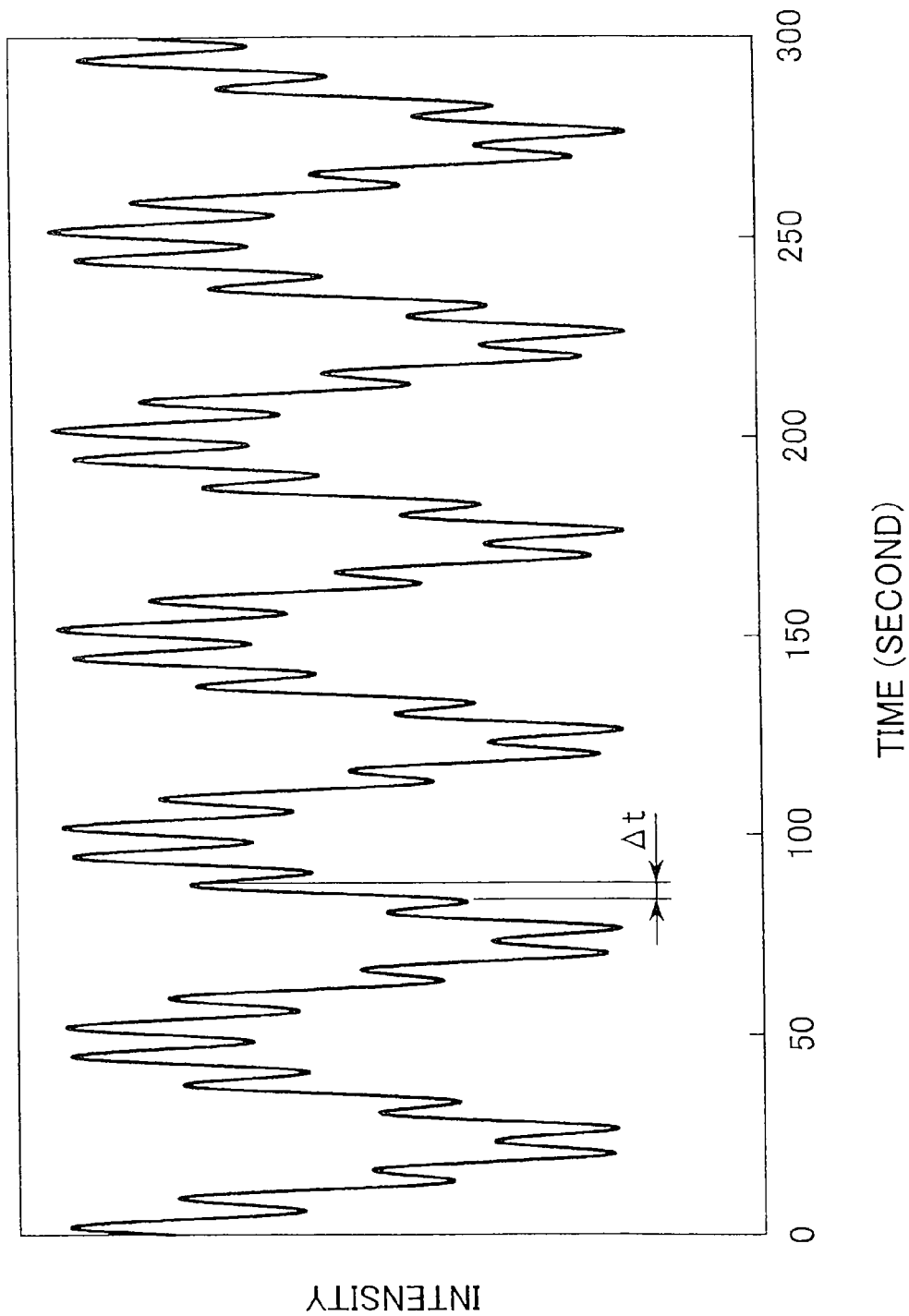
FIG. 23 is a diagram showing a superposed interference wave.
Figure 24:
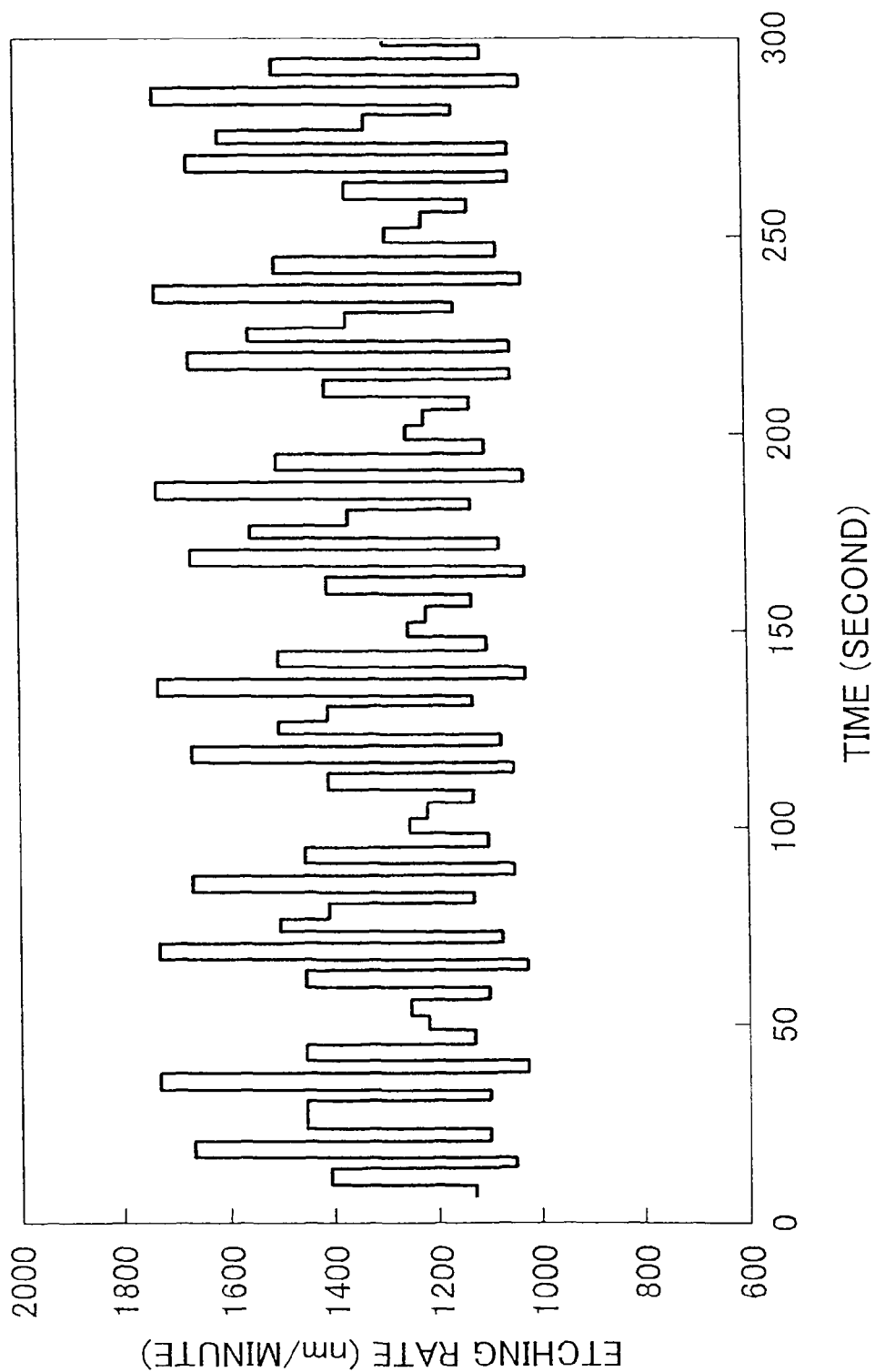
FIG. 24 is a diagram showing the etching rate obtained from the time period between extreme values of an interference wave.
Figure 26A:
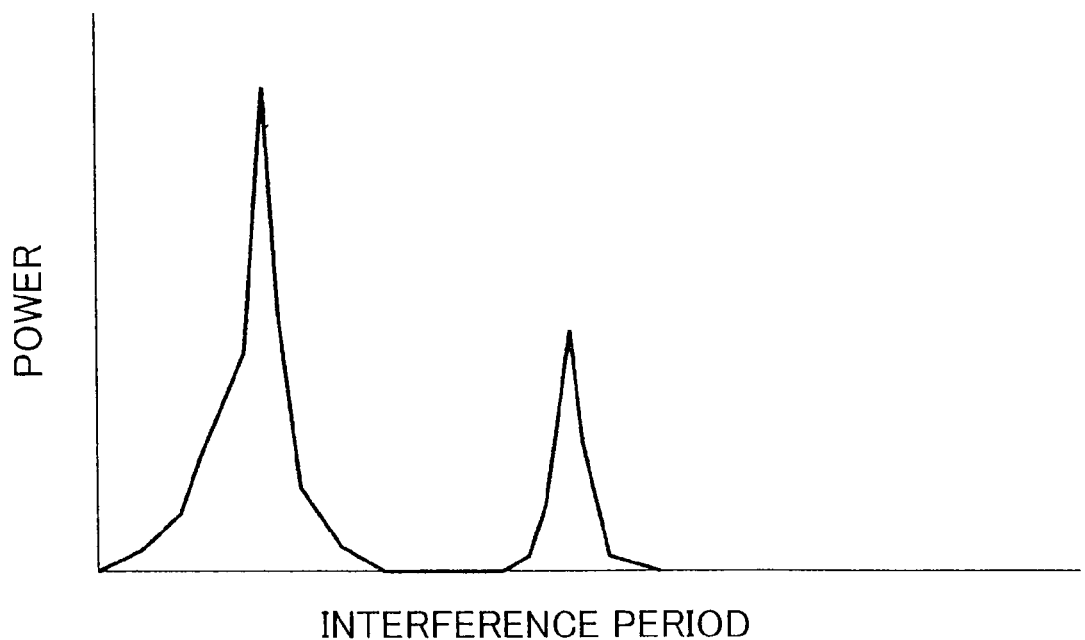
Figure 26B:
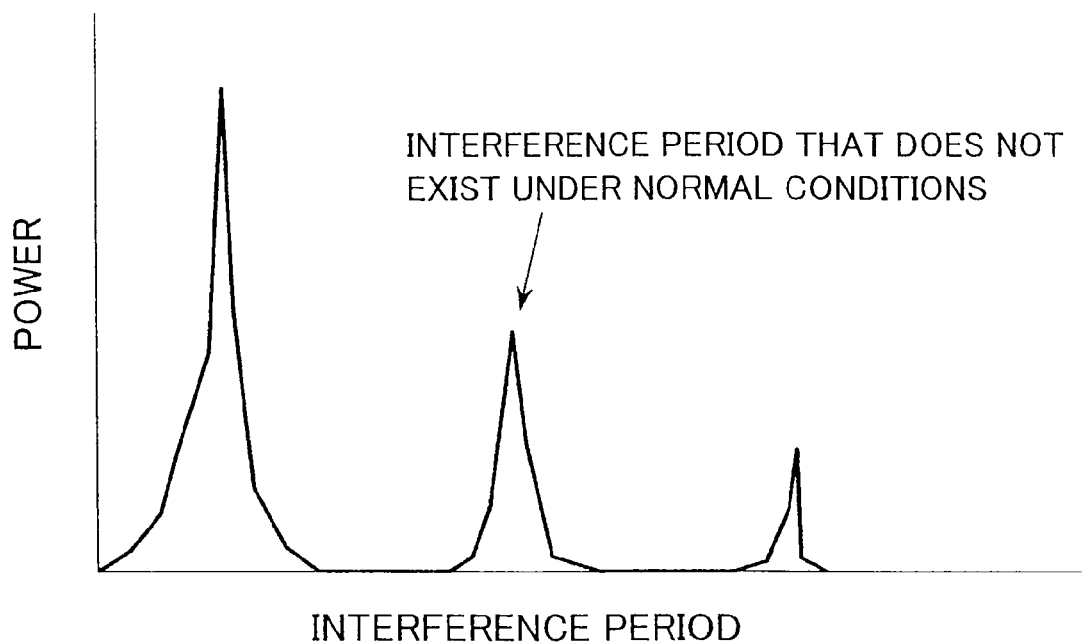

As a result of comparison between the graphs of FIGS. 20 and 21, it was found that in the case where the etching amount calculating method in FIG. 6 is executed, the etching rate is stable when the opening rate is 5%, but the etching rate is stable when the opening rate is 0.5%, and on the other hand, in the case where the etching amount calculating method in FIG. 15 is executed, the etching rate is stable irrespective of whether the opening rate is 5% or 0.5%. Thus, it was found that if a waveform in a window is extracted, and an approximate waveform of the extracted waveform is removed from the extracted waveform in the window before a frequency analysis of the extracted waveform in the window is carried out, the etching rate can be accurately obtained even if the opening rate is small.

What is claimed is:
1. An etching amount calculating method for calculating an etching amount of a concave portion that is formed in a substrate using a mask film by etching the substrate, comprising:
   an irradiating step of irradiating light on the substrate;
   a light receiving step of receiving superposed interference light resulting from superposition of at least interference light of reflected light from the mask film and reflected light from a bottom of the concave portion on other interference light;
   an interference wave calculating step of calculating a superposed interference wave from the received superposed interference light;
   a waveform extracting step of extracting a waveform in a predetermined time period from the superposed interference wave;
   a frequency analyzing step of carrying out a frequency analysis of the extracted waveform;
   an interference period detecting step of detecting a period of an interference wave produced from the reflected light from the mask film and the reflected light from the bottom of the concave portion from a frequency distribution obtained by the frequency analysis;

an integrating and averaging step of repeating said interference wave calculating step, said waveform extracting step, said frequency analyzing step, and said interference period detecting step while shifting the predetermined time period by a predetermined time, and integrating and averaging the detected periods of the interference wave at each repetition; and an etching amount calculating step of calculating the etching amount of the concave portion based on the integrated and averaged periods of the interference wave.

2. An etching amount calculating method as claimed in claim 1, wherein the predetermined time period is longer than one period of a waveform of the other interference light whose period is longer than the period of the interference wave produced from the reflected light from the mask film and the reflected light from the bottom of the concave portion.

3. An etching amount calculating method as claimed in claim 1, further comprising a pre-analysis processing step of removing almost all of a part occupied by the waveform of the other interference light from the waveform in the predetermined time period extracted from the superposed interference wave,
wherein in said frequency analyzing processing step, a frequency analysis of the waveform from which almost all of the part occupied by the waveform of the other interference light has been removed is carried out.

4. An etching amount calculating method as claimed in claim 3, wherein in said pre-analysis processing step, a waveform obtained by approximating the extracted waveform by a quadratic polynomial is removed from the extracted waveform.

5. An etching amount calculating method as claimed in claim 3, wherein the predetermined time period is not more than a ¼ period of the waveform of the other interference light.

6. An etching amount calculating method as claimed in claim 3, wherein an opening rate of the concave portion on the surface of the substrate is not more than 0.5%, or the concave portion is a deep trench.

7. An etching amount calculating method as claimed in claim 1, wherein in the frequency analysis, a maximum entropy method is used.

8. An etching amount calculating method as claimed in claim 1, further comprising an interference period correcting step of removing the period of the interference wave in the case where the period of the interference wave detected from the frequency distribution corresponds to an abnormal value.

9. An etching amount calculating method as claimed in claim 8, wherein in said interference period correcting step, the period of the interference wave obtained from the predetermined time period before or the predetermined time period after the predetermined time period in which the period of the interference wave corresponding to the abnormal value is obtained is regarded as the period of the interference wave of the predetermined time period in which the period of the interference wave corresponding to the abnormal value is obtained.

10. An etching amount calculating method as claimed in claim 1, wherein the period of the interference wave produced from the reflected light from the mask film and the reflected light from the bottom of the concave portion is estimated in advance, and
in said interference period detecting step, in the frequency distribution obtained by the frequency analysis, the period of the interference wave produced from the reflected light from the mask film and the reflected light from the bottom of the concave portion is detected from a vicinity of the estimated period.

11. An etching amount calculating method as claimed in claim 1, wherein the other interference light is interference light of reflected light from a surface of the mask film and reflected light from a boundary surface between the mask film and a surface of the substrate.

12. A computer-readable storage medium storing a program for causing a computer to execute an etching amount calculating method for calculating an etching amount of a concave portion that is formed in a substrate using a mask film by etching the substrate, the etching amount calculating method comprising:

an irradiating step of irradiating light on the substrate;

a light receiving step of receiving superposed interference light resulting from superposition of at least interference light of reflected light from the mask film and reflected light from a bottom of the concave portion on other interference light;

an interference wave calculating step of calculating a superposed interference wave from the received superposed interference light;

a waveform extracting step of extracting a waveform in a predetermined time period from the superposed interference wave;

a frequency analyzing step of carrying out a frequency analysis of the extracted waveform;

an interference period detecting step of detecting a period of an interference wave produced from the reflected light from the mask film and the reflected light from the bottom of the concave portion from a frequency distribution obtained by the frequency analysis;

an integrating and averaging step of repeating the interference wave calculating step, the waveform extracting step, the frequency analyzing step, and the interference period detecting step while shifting the predetermined time period by a predetermined time, and integrating and averaging the detected periods of the interference wave at each repetition; and an etching amount calculating step of calculating the etching amount of the concave portion based on the integrated and averaged periods of the interference wave.

13. An etching amount calculating apparatus that calculates an etching amount of a concave portion that is formed in a substrate using a mask film by etching the substrate, comprising:

an irradiating unit that irradiates light on the substrate;

a light receiving unit that receives superposed interference light resulting from superposition of at least interference light of reflected light from the mask film and reflected light from a bottom of the concave portion on other interference light;

an interference wave calculating unit that calculates a superposed interference wave from the received superposed interference light;

a waveform extracting unit that extracts a waveform of a predetermined time period from the superposed interference wave;

a frequency analyzing unit that carries out a frequency analysis of the extracted waveform;

an interference period detecting unit that detects a period of an interference wave produced from the reflected light from the mask film and the reflected light from the bottom of the concave portion from a frequency distribution obtained by the frequency analysis;

an integrating and averaging unit that repeats the interference wave calculation, the waveform extraction, the frequency analysis, and the interference period detection while shifting the predetermined time period by a predetermined time, and integrates and averages the detected periods of the interference wave at each repetition; and an etching amount calculating unit that calculates the etching amount of the concave portion based on the integrated and averaged period of the interference wave.

* * * * *